(12) United States Patent
Li et al.

(10) Patent No.: US 9,112,498 B2
(45) Date of Patent: Aug. 18, 2015

(54) DYNAMIC MOSFET GATE DRIVERS

(75) Inventors: Yong Li, San Jose, CA (US); Fuqiang Shi, Oak Park, IL (US); Andrew Kwok-Cheung Lee, Union City, CA (US); David Nguyen, Santa Clara, CA (US); Jiang Chen, Cupertino, CA (US)

(73) Assignee: Dialog Semiconductor Inc., Campbell, CA (US)

( * ) Notice: Subject to any disclaimer, the term of this patent is extended or adjusted under 35 U.S.C. 154(b) by 306 days.

(21) Appl. No.: 13/568,976

(22) Filed: Aug. 7, 2012

(65) Prior Publication Data

US 2013/0107584 A1    May 2, 2013

Related U.S. Application Data

(60) Provisional application No. 61/554,407, filed on Nov. 1, 2011.

(51) Int. Cl.
*H02M 3/335*    (2006.01)
*H02M 1/08*    (2006.01)
*H03K 17/16*    (2006.01)

(52) U.S. Cl.
CPC ............ *H03K 17/166* (2013.01); *H02M 1/08* (2013.01); *H02M 3/335* (2013.01); *H02M 3/33523* (2013.01)

(58) Field of Classification Search
CPC .. H02M 1/08; H02M 3/335; H02M 3/333523
USPC ............................................. 327/109; 326/83
See application file for complete search history.

(56) References Cited

U.S. PATENT DOCUMENTS

| | | |
|---|---|---|
| 5,513,088 A | 4/1996 | Williamson |
| 5,805,434 A | 9/1998 | Vinciarelli et al. |
| 6,295,217 B1 | 9/2001 | Yang et al. |
| 7,061,780 B2 | 6/2006 | Yang et al. |
| 2004/0051509 A1 | 3/2004 | Matsuo et al. |
| 2007/0109707 A1 | 5/2007 | Honda |
| 2008/0180130 A1 | 7/2008 | Hayami et al. |
| 2010/0202165 A1* | 8/2010 | Zheng et al. ............... 363/21.13 |
| 2010/0225363 A1* | 9/2010 | Takahashi et al. ............ 327/109 |
| 2012/0075890 A1* | 3/2012 | Ozawa ....................... 363/21.17 |

FOREIGN PATENT DOCUMENTS

| | | |
|---|---|---|
| CN | 101231626 A | 7/2008 |
| JP | 2000-166228 A | 6/2000 |

OTHER PUBLICATIONS

Korean Intellectual Property Office, Office Action, Korean Patent Application No. 10-2012-0117665, Sep. 24, 2013, eight pages.

(Continued)

*Primary Examiner* — Fred E Finch, III
*Assistant Examiner* — Rafael O De Leon Domenech
(74) *Attorney, Agent, or Firm* — Fenwick & West LLP

(57) ABSTRACT

The embodiments herein describe a dynamic metal-oxide-semiconductor field-effect transistor (MOSFET) gate driver system architecture and control scheme. The MOSFET gate driver system dynamically adjusts both the gate driver turn-on-resistance and the gate driver turn-off resistance within a single (i.e., one) switching cycle to reduce electromagnetic interference (EMI) in the system and to minimize the conduction loss of a power MOSFET during operation.

14 Claims, 17 Drawing Sheets

(56) References Cited

OTHER PUBLICATIONS

State Intellectual Property Office of the People's Republic of China, First Office Action, Chinese Patent Application No. 201210407021.6, Aug. 4, 2014, twenty-six pages.

Taiwan Intellectual Property Office, Office Action, Taiwan Patent Application No. 101133375, May 27, 2014, seven pages.

State Intellectual Property Office of the People's Republic of China, Second Office Action, Chinese Patent Application No. 201210407021.6, Mar. 9, 2015, seventeen pages.

* cited by examiner

DYNAMIC MOSFET GATE DRIVERS

CROSS-REFERENCE TO RELATED APPLICATION

This application claims priority under 35 U.S.C. §119(e) from co-pending U.S. Provisional Application No. 61/554,407, filed on Nov. 1, 2011, which is incorporated by reference herein in its entirety.

BACKGROUND

1. Field of Technology

Embodiments disclosed herein relate generally to a gate driver system architecture and control scheme, and more specifically, to a gate driver system that dynamically adjusts drive current during a single switching cycle.

2. Description of the Related Arts

A power metal-oxide-semiconductor field-effect transistor (MOSFET) is a commonly used semi-conductor switching device in power electronics systems including switching-mode power supplies. The gate driver for the power MOSFET is critical to achieving high performance, such as low electromagnetic interference (EMI), high efficiency and good control performance. FIG. 1 is a circuit diagram illustrating a conventional flyback type switching power converter 100 that uses a MOSFET Q1. The switching power converter 100 includes a power stage 105 and a secondary output stage 107. Power stage 105 includes the MOSFET Q1 and a power transformer T1. Power transformer T1 includes primary winding Np, secondary winding Ns, and auxiliary winding Na. Secondary output stage 107 includes diode $D_1$ and output capacitor $C_1$. Controller 101 controls the ON state and the OFF state of MOSFET Q1 using output drive signal 102 in the form of a pulse with on-times ($T_{ON}$) and off-times ($T_{OFF}$). In other words, the controller 101 generates the output drive signal 102 that drives the MOSFET Q1.

AC power is received from an AC power source (not shown) and is rectified to provide the unregulated input voltage $V_{DC}$. The input power is stored in transformer T1 while the switch Q1 is turned on, because the diode $D_1$ becomes reverse biased when the MOSFET Q1 is turned on. The rectified input power is then transferred to an electronic device across the capacitor $C_1$ while the switch Q1 is turned off, because the diode $D_1$ becomes forward biased when the MOSFET Q1 is turned off. Diode $D_1$ functions as an output rectifier and capacitor $C_1$ functions as an output filter. The resulting regulated output voltage $V_{OUT}$ is delivered to the electronic device.

As mentioned previously, the controller 101 generates appropriate switch drive pulses 102 to control the on-times and off-times of MOSFET Q1 and regulate the output voltage $V_{OUT}$. The controller 101 controls MOSFET Q1 using a feedback loop based on the sensed output voltage $V_{SENSE}$ and the sensed primary side current $I_D$ in previous switching cycles of the switching power converter, in a variety of operation modes including PWM (pulse width modulation) and/or PFM (pulse frequency modulation) modes. $I_{SENSE}$ is used to sense the primary current $I_D$ through the primary winding Np and switch Q1 in the form of a voltage across sense resistor $R_S$.

The output voltage $V_{OUT}$ is reflected across auxiliary winding Na of transformer T1, which is input to controller 101 as the voltage $V_{SENSE}$ via a resistive voltage divider comprised of resistors $R_1$ and $R_2$. Based on the sensed output voltage, the controller 101 determines the operating frequency of the switching power converter 100 which dictates the frequency of the on-times ($T_{ON}$) and off-times ($T_{OFF}$) in the output drive signal 102.

FIG. 2 illustrates a conventional gate driver system configuration included in the controller 101. The driver final stage comprises a high-side PMOS $Q_P$ and a low-side NMOS $Q_N$. The high-side PMOS source is connected to Vcc, and the low-side NMOS source is connected to ground (GND). As shown in FIG. 2, the controller 101 comprises a gate driver control circuit 201. The gate driver control circuit 201 generates a switch control signal S, and the driver signals $S_P$ and $S_N$ respectively for the PMOS $Q_P$ and the NMOS $Q_N$.

FIG. 3 illustrates an equivalent circuit model often used for the analysis of MOSFET switching performance. The switching performance of a device is determined by the time required to establish voltage changes across parasitic capacitances of the device. $R_G$ represents the distributed resistance of the gate of the MOSFET. $L_S$ and $L_D$ respectively represent the source and drain lead inductances of the MOSFET. $C_{GD}$ represents the gate-to-drain capacitance (i.e., the miller capacitance) of the MOSFET and is a nonlinear function of voltage. $C_{GS}$ and $C_{DS}$ respectively represent the gate-to-source capacitance and the drain-to-source capacitance of the MOSFET. Lastly, the equivalent circuit model illustrates the body-drain diode across the drain and source of the MOSFET.

The MOSFET operation can be understood referring to detailed waveforms illustrated in FIG. 4. Generally, FIG. 4 illustrates the current $I_{SENSE}$ which corresponds to the drain current $I_D$ of the power MOSFET Q1, the switch control signal S, the gate driver signal $S_N$ for the driver low-side NMOS $Q_N$, the gate driver signal $S_P$ for the driver high-side PMOS $Q_P$, the gate-to-source voltage $V_{GS}$ of the MOSFET Q1, and the drain-to-source voltage $V_{DS}$ of the MOSFET Q1 at various times within a switching cycle.

At time $t_0$, the controller 101 turns on Q1 by issuing a high 401 switch control signal S and turns off the low-side NMOS $Q_N$ by issuing a low 403 gate driver signal $S_N$. At time $t_1$, after a short-time delay that prevents shoot through between the high-side PMOS $Q_P$ and low-side NMOS $Q_N$, the controller 101 sets the gate driver signal $S_P$ to low 405 which turns on the high-side PMOS $Q_P$. During the time interval [$t_1$, $t_2$], the gate drive current charges the input capacitor of Q1. The current flows through the high-side PMOS $Q_P$, and the on-state resistance Rds(on)_P of the high-side PMOS $Q_P$ serves as the gate resistance $R_g$ that affects the drive current used to drive power MOSFET Q1. When the gate-to-source voltage $V_{GS}$ of Q1 rises 407 above the threshold voltage $V_{TH}$ for MOSFET Q1, Q1 starts to conduct. During the time interval [$t_1$, $t_2$], the drain-to-source voltage $V_{DS}$ of MOSFET Q1 still maintains high voltage 409, e.g., $V_{DS}=V_{DC}$. $V_{DC}$ can be ~300V or higher depending on the system configuration.

During the time interval [$t_2$, $t_3$], the gate-to-source voltage $V_{GS}$ of Q1 reaches a plateau 411 and stays at this plateau 411. Furthermore, the drive current mainly charges the miller capacitor $C_{GD}$ of Q1. As shown in FIG. 4, the drain-to-source voltage $V_{DS}$ of Q1 decreases 413 during time interval [$t_2$, $t_3$] represented by dV/dt. The rate of change dV/dt of the drain-to-source voltage $V_{DS}$ of Q1 coupled with the drain-to-source capacitor $C_{DS}$ of Q1 and the parasitic capacitance of the transformer generates the current spike 415 in the drain current $I_D$ by means of C*dV/dt. During the time interval [$t_3$, $t_4$], when the drain-to-source voltage $V_{DS}$ of Q1 decreases to a low level 417, the miller capacitor $C_{GD}$ is fully charged, and the drive current mainly charges the gate-to-source capacitor $C_{GS}$ of Q1. During the time interval [$t_3$, $t_4$], the gate-to-source voltage $V_{GS}$ rises 419 and eventually reaches near $V_{CC}$. The turn-on transition of Q1 is completed. During the time interval [$t_4$, $t_5$], the gate-to-source voltage $V_{GS}$ is maintained near $V_{CC}$ and the drain-to-source voltage $V_{DS}$ of Q1 remains at the low level 417. Furthermore, during the time interval [$t_4$, $t_5$], the drain current $I_D$ rises 421 towards the ideal peak.

At time $t_5$, the controller 101 decides to turn-off Q1 shown by the switch control signal S going low 423, and the gate driver signal Sp is set high 425 which turns off the high-side PMOS $Q_P$. As shown in FIG. 4, the drain current $I_D$ reaches the ideal peak at time $t_5$. At time $t_5$, the gate driver signal $S_N$ remains low 403. Furthermore, at time $t_5$ the gate-to-source voltage $V_{GS}$ is maintained near $V_{CC}$ and the drain-to-source voltage $V_{DS}$ of Q1 remains at the low level 417.

At time $t_6$, after a short time delay that prevents the shoot through between the high side PMOS $Q_P$ and the low side NMOS $Q_N$, the gate driver signal $S_N$ is set to high 427 which turns on the low side NMOS $Q_N$. During time interval [$t_6$, $t_7$], the low side NMOS $Q_N$ provides the path to discharge capacitor $C_{GS}$, and the on-state resistance Rds(on)_N of the low side NMOS $Q_N$ affects the discharge current. As shown in FIG. 4, the gate-to-source voltage $V_{GS}$ of Q1 decreases 429 from $V_{CC}$ to a plateau 431 that is less than $V_{CC}$ but greater than $V_{TH}$ and the drain-to-source voltage $V_{DS}$ of Q1 stays at the low level 417.

During the time interval [$t_7$, $t_8$], the gate-to-source voltage $V_{GS}$ of Q1 remains at the plateau 431 and the drive current mainly discharges the miller capacitor $C_{GD}$ of Q1. Furthermore, the drain-to-source voltage $V_{DS}$ rises 433 towards the high voltage 409 during the time interval [$t_7$, $t_8$] which is represented by dV/dt. During the time interval [$t_8$, $t_9$], (without considering high-frequency ringing and other parasitic effects) the drain-to-source voltage $V_{DS}$ of Q1 reaches the maximum DC voltage 409 and the drive current mainly discharge the capacitor $C_{GS}$. Furthermore, the gate-to-source voltage $V_{GS}$ of Q1 decreases 435. Once the gate-to-source voltage $V_{GS}$ decreases below the threshold voltage $V_{TH}$, Q1 is turned off and the drain current $I_D$ reaches the actual peak at time $t_9$ and decays 437 to zero. The turn-off transition of the Q1 is completed.

SUMMARY

Embodiments of a dynamic MOSFET gate driver system architecture and control scheme is described that minimizes EMI and conduction losses of a power MOSFET during operation. In one embodiment, a gate driver is coupled to the gate of a power MOSFET. Within a single switching cycle of the switching power converter, the gate driver varies the drive current at the gate of the MOSFET during the turn-on operation of the MOSFET to reduce EMI and conduction losses during the turn-on operation. Additionally, during the turn-off operation of the MOSFET within the switching cycle, the gate driver also varies the drive current at the gate of the MOSFET to reduce the turn-off delay time and to reduce EMI.

In one embodiment, to vary the drive current of the power MOSFET, the MOSFET gate driver system dynamically adjusts the gate driver turn-on resistance and/or the gate driver turn-off resistance within a single (i.e., one) switching cycle of the switching power converter to reduce EMI in the system and to minimize the conduction loss of a power MOSFET during operation. During the on-time of the switching cycle, the system sets a relatively large turn-on-resistance at the initial turn-on period to reduce the rate of voltage change over time of the drain-to-source voltage of the MOSFET. By reducing the rate of voltage change over time, EMI is reduced. Furthermore, the gate driver transitions the turn-on-resistance to a lower resistance to reduce the conduction loss of the power MOSFET that is being driven by the driver of the system. During the turn-off time of the switching cycle, the gate driver sets a relatively small turn-off resistance at the initial turn-off period to reduce the turn-off delay time and transitions the turn-off resistance to a larger resistance to reduce the rate of change of the drain-to-source voltage of the MOSFET. By reducing the rate of change, EMI is reduced.

The features and advantages described in the specification are not all inclusive and, in particular, many additional features and advantages will be apparent to one of ordinary skill in the art in view of the drawings and specification. Moreover, it should be noted that the language used in the specification has been principally selected for readability and instructional purposes, and may not have been selected to delineate or circumscribe the inventive subject matter.

BRIEF DESCRIPTION OF THE DRAWINGS

The teachings of the embodiments of the present disclosure can be readily understood by considering the following detailed description in conjunction with the accompanying drawings.

DETAILED DESCRIPTION OF EMBODIMENTS

The Figures (FIG.) and the following description relate to various embodiments by way of illustration only. It should be noted that from the following discussion, alternative embodiments of the structures and methods disclosed herein will be readily recognized as viable alternatives that may be employed without departing from the principles discussed herein.

Reference will now be made in detail to several embodiments, examples of which are illustrated in the accompanying figures. It is noted that wherever practicable similar or like reference numbers may be used in the figures and may indicate similar or like functionality. The figures depict various embodiments for purposes of illustration only. One skilled in the art will readily recognize from the following description that alternative embodiments of the structures and methods illustrated herein may be employed without departing from the principles described herein.

As previously described above, FIG. 4 illustrates switching waveforms of the MOSFET in a conventional flyback type switching power converter. During the time interval [$t_2$, $t_3$], the drain-to-source voltage $V_{DS}$ falls 413 from a high DC voltage 409 towards zero. The high rate of voltage change dV/dt of the drain-to-source voltage coupled with parasitic capacitors causes current spike 415 and EMI noise problems (i=C*dV/dt). It is desirable to reduce the rate of voltage change dV/dt of the drain-to-source voltage $V_{DS}$ in most applications. For a given high DC voltage, the longer the duration of time interval [$t_2$, $t_3$], the smaller the rate of change dV/dt of the drain-to-source voltage $V_{DS}$. For a given power MOSFET with a given input capacitor, reducing the drive current $I_D$ can reduce the rate of voltage change dV/dt of the drain-to-source voltage $V_{DS}$. Therefore, increasing the gate resistance $R_g$, which is the high-side PMOS Rds(on)_P, is a technique to reduce EMI.

Figure 5:
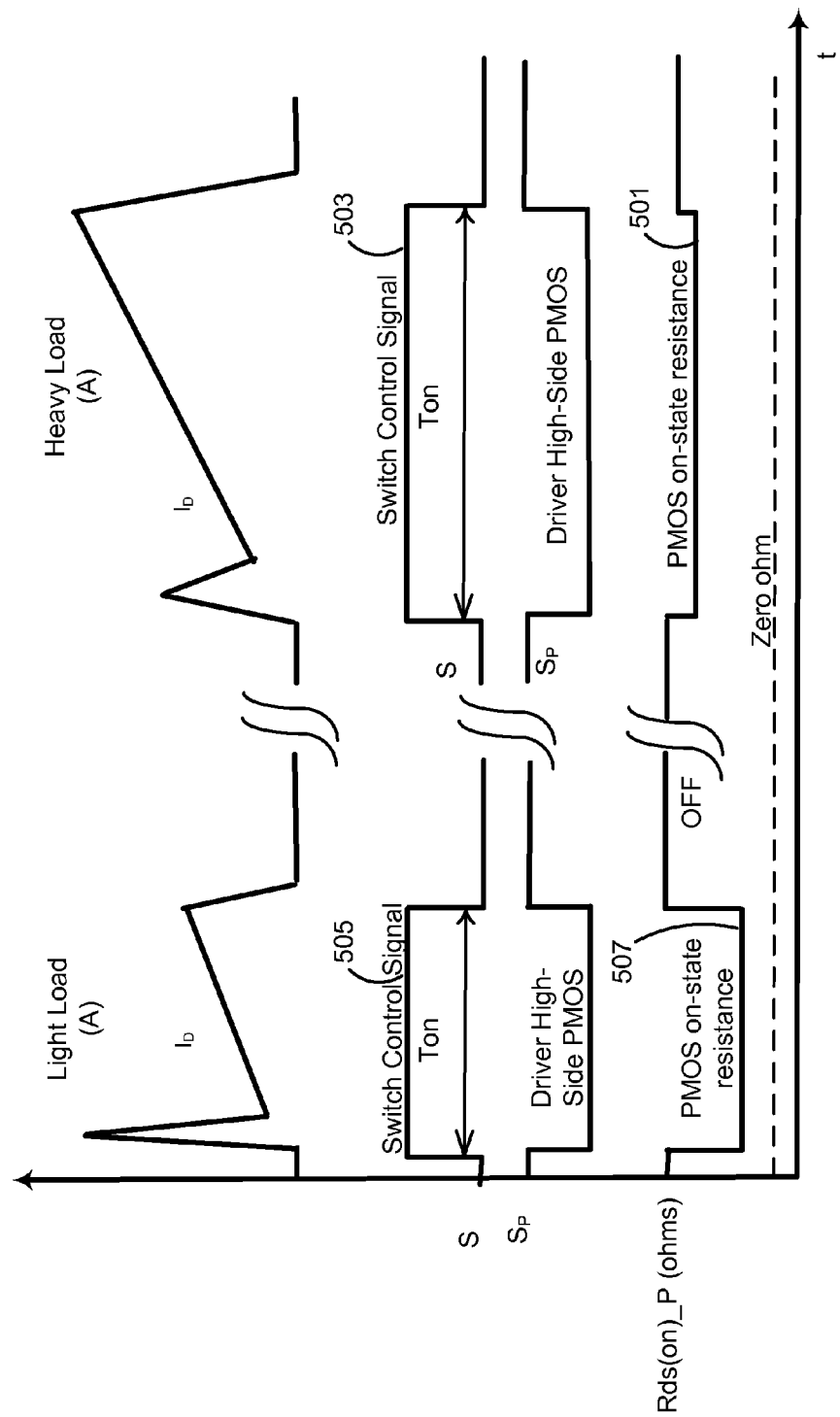
FIG. 5 illustrates switching waveforms of the conventional fixed gate resistance at various power supply operation load conditions.

Most present gate drivers use a fixed gate resistance $R_g$ or a fixed Rds(on)_P, which is difficult to cover different power supply operation conditions. There are various solutions that dynamically control the Rds(on)_P based on power supply operations. FIG. 5 illustrates the fixed values Rds(on)_P at various operating conditions. FIG. 5 illustrates that a larger 501 fixed value of Rds(on)_P (i.e., the PMOS on-state resistance) is used at heavy load and a long 503 on-time $T_{on}$ conditions compared to light load conditions. During light load and a shorter 505 on-time $T_{on}$ conditions, a smaller 507 fixed Rds(on)_P is used compared to the fixed value of Rds (on)_P used at heavy load. Thus, for both light load and heavy load conditions, a fixed Rds(on)_P value is used within one switching cycle.

Figure 4:
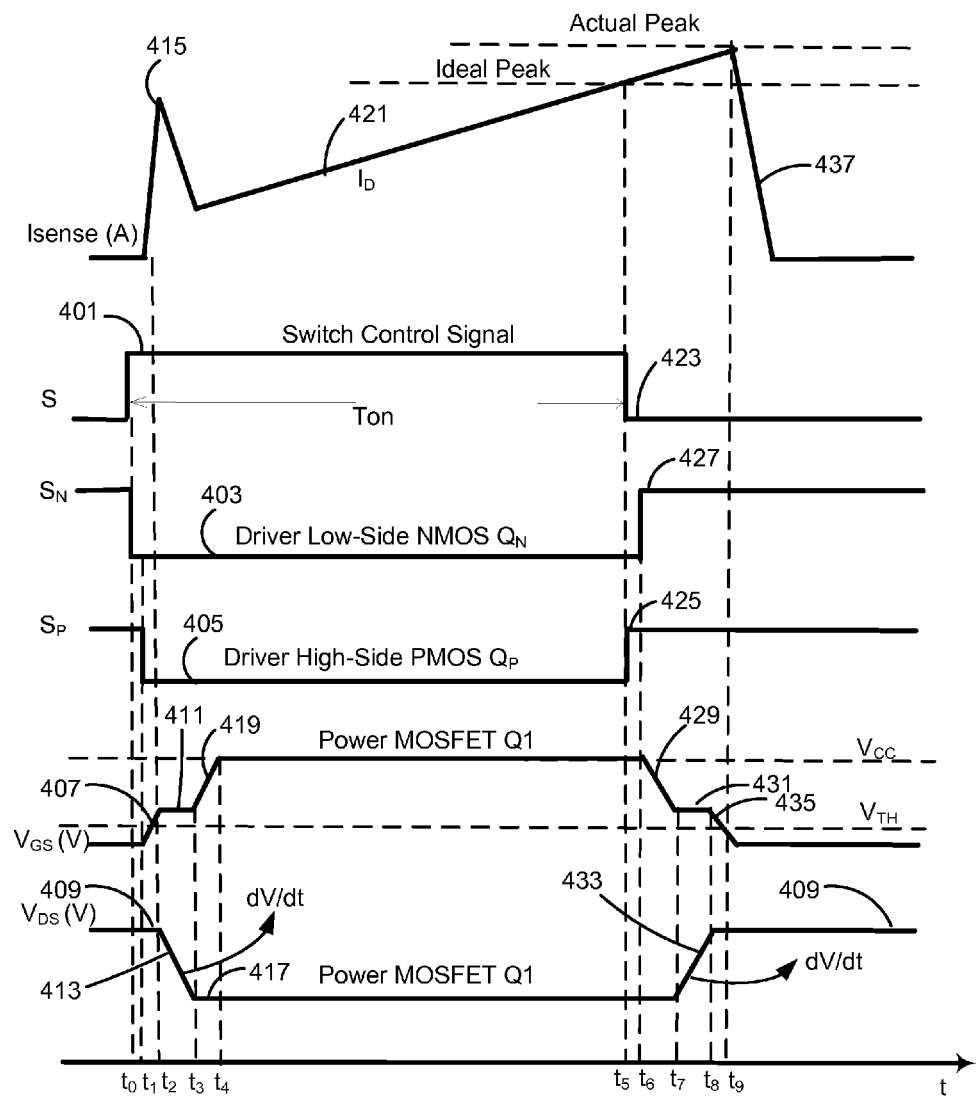
FIG. 4 illustrates a detailed view of the switching waveforms of the conventional switching power converter.

For power supplies operating in discontinuous conduction mode (DCM), since the switching current is zero prior to the turn-on, increasing Rds(on)_P normally does not increase switching loss. However, increasing Rds(on)_P can increase the conduction loss as a result of increasing Rds(on)_P during time interval [$t_3$, $t_4$]. Referring back to FIG. 4, please note at time interval [$t_3$, $t_4$], the drain-to-source voltage $V_{DS}$ of Q1 drops to a low level 417, but does not completely reach zero volts. Furthermore, the gate-to-source voltage $V_{GS}$ of Q1 increases 419 from the plateau 411 towards $V_{CC}$ during time interval [$t_3$, $t_4$]. Increasing the value of Rds(on)_P results in a slower increase rate of the gate-to-source voltage $V_{GS}$ of Q1. This can cause the time interval [$t_3$, $t_4$] to contribute to a significant portion within the on-time $T_{on}$, during which $V_{GS}$ is increasing 419 and may result in $V_{GS}$ reaching a much lower value than the steady state value $V_{CC}$. Typically, the Rds(on) of MOSFETs decreases with higher gate-to-source voltages $V_{GS}$. As a result, the higher Rds(on)_P in the gate driver will increase the Rds(on) of power MOSFET Q1 during time interval [$t_3$, $t_4$]. Since the drain current $I_D$ has already built up during this period and is increasing 421 as shown in FIG. 4, the drain-to-source voltage $V_{DS}$ of Q1 will increase ($V_{DS}=I_D*Rds(on)$). The product of the drain current $I_D$ and the drain-to-source voltage $V_{DS}$ of Q1 generates conduction loss and reduces the efficiency.

Figure 6A:
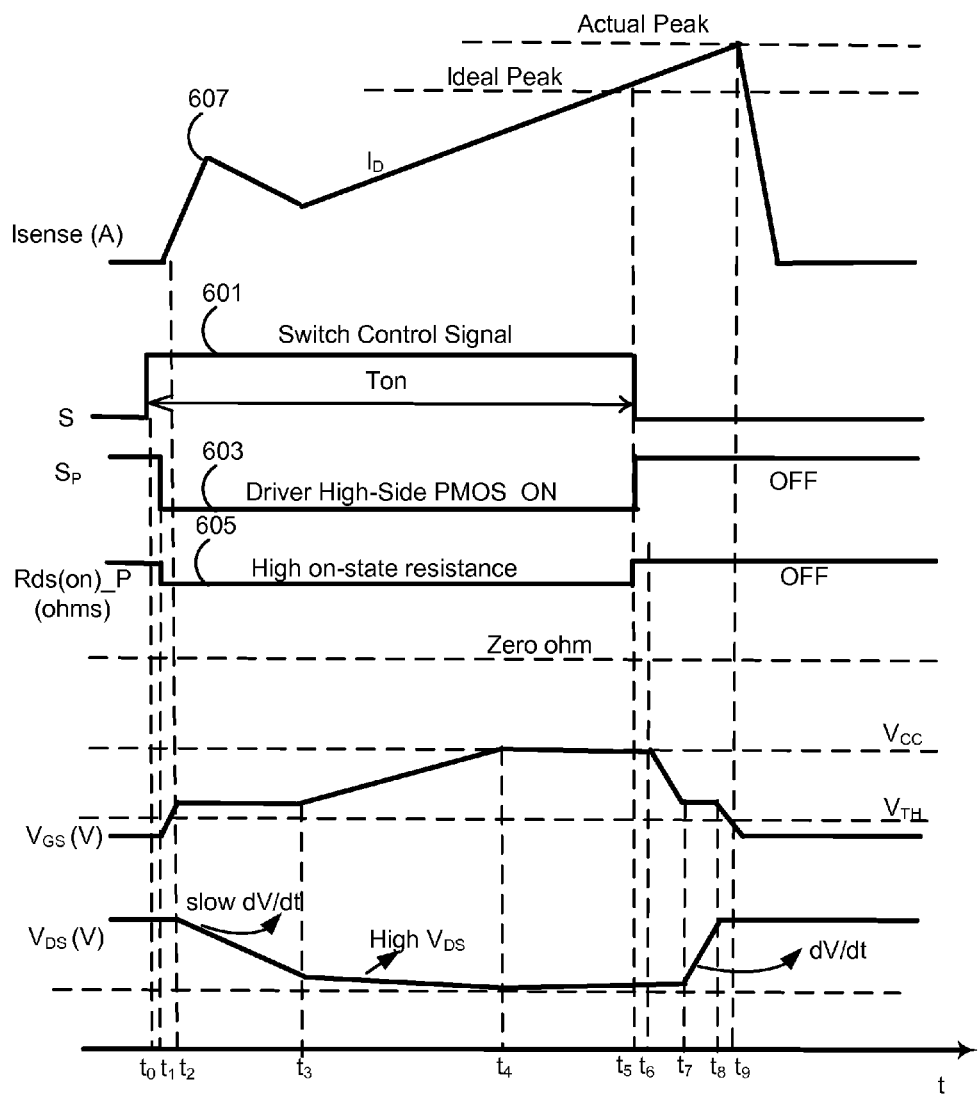
FIG. 6A illustrates switching waveforms of the conventional switching power converter when using a fixed high gate resistance at on-time.
Figure 6B:
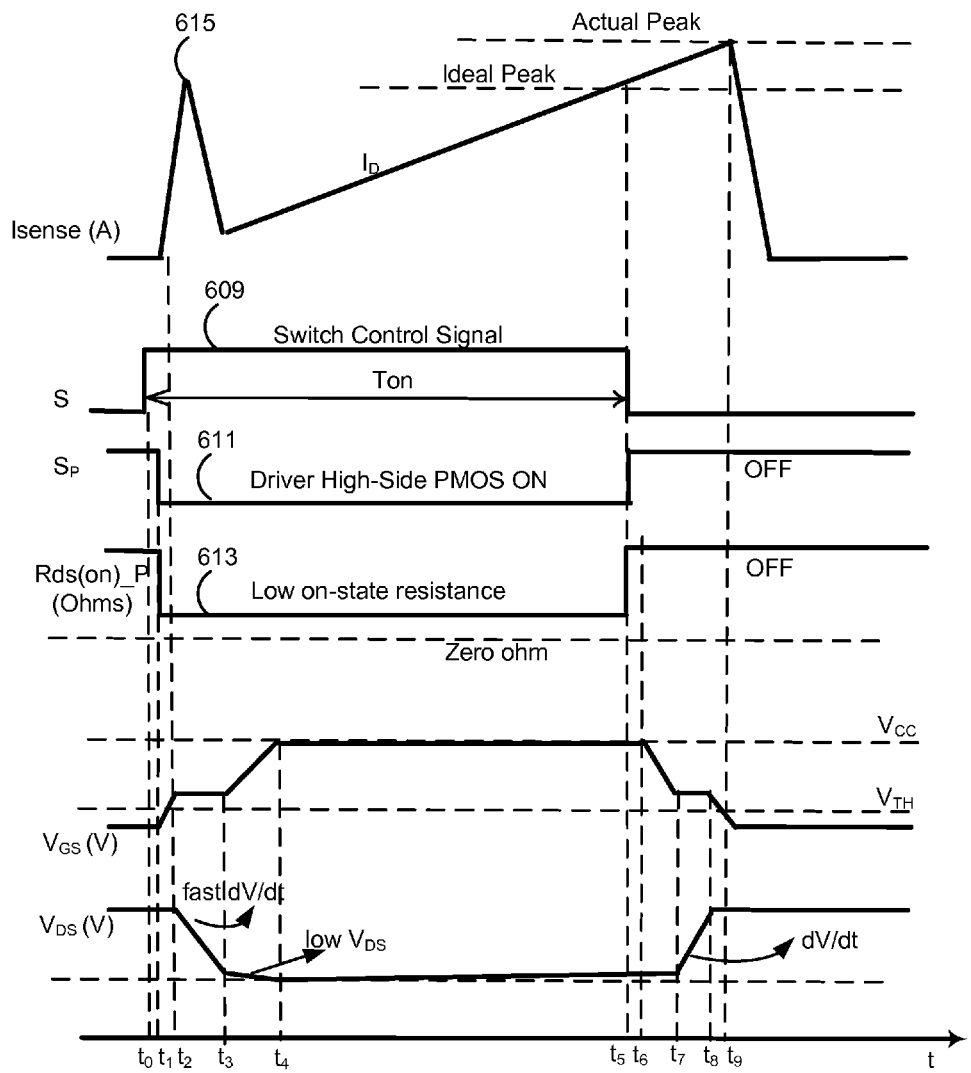
FIG. 6B illustrates switching waveforms of the conventional switching power converter when using a fixed low gate resistance in the gate driver at on-time.

FIG. 6A and FIG. 6B respectively illustrate the conventional application of high fixed Rds(on)_P and low Rds(on)_P values in the gate driver during the turn-on operation. As shown in FIG. 6A, at time $t_0$, MOSFET Q1 is turned on shown by the switch control signal going high 601. At time $t_1$, after a short delay the gate driver signal $S_p$ is set low 603 which turns on the high side PMOS $Q_P$ and a fixed high 605 on-state resistance Rds(on)_P is set. Using a high 605 fixed Rds(on)_P reduces the rate of voltage change dV/dt (i.e., lower slope) of the drain-to-source voltage of Q1 during time interval [$t_2$, $t_3$] thereby reducing EMI due to the lower current spike 607, but increases conduction loss because of the longer duration between time interval [$t_3$, $t_4$].

As shown in FIG. 6B, at time $t_0$, MOSFET Q1 is turned on shown by the switch control signal going high 609. At time $t_1$, after a short delay the gate driver signal $S_p$ is set low 611 which turns on the high side PMO $Q_P$ and a fixed low 613 on-state resistance Rds(on)_ is set. Using a low Rds(on)_P increases the rate of voltage change dV/dt (i.e., higher slope) of the drain-to-source voltage during time interval [$t_2$, $t_3$] compared to the rate of voltage change of the drain-to-source voltage during time interval [$t_2$, $t_3$] in FIG. 6A. This results in increased EMI due to the higher current spike 615, although the conduction loss is lower. Thus, using a fixed Rds(on)_P within one switching cycle cannot provide both a slower rate of voltage change dV/dt of the drain-to-source voltage and smaller conduction loss at the same time during turn-on operation. This situation worsens under varying values of Vcc and turn-on time $T_{on}$ conditions.

Furthermore, increasing the MOSFET conduction loss also degrades the power supply efficiency which may prevent the power supply from passing certain energy regulation standards and will also degrade the thermal capability of the power supply. Generally, the size of electronic equipment is becoming smaller and smaller. With the smaller size, the thermal management becomes more difficult. If a power supply cannot handle the heat for a given size of electronic equipment, the power supply and/or the end product may fail.

Figure 7A:
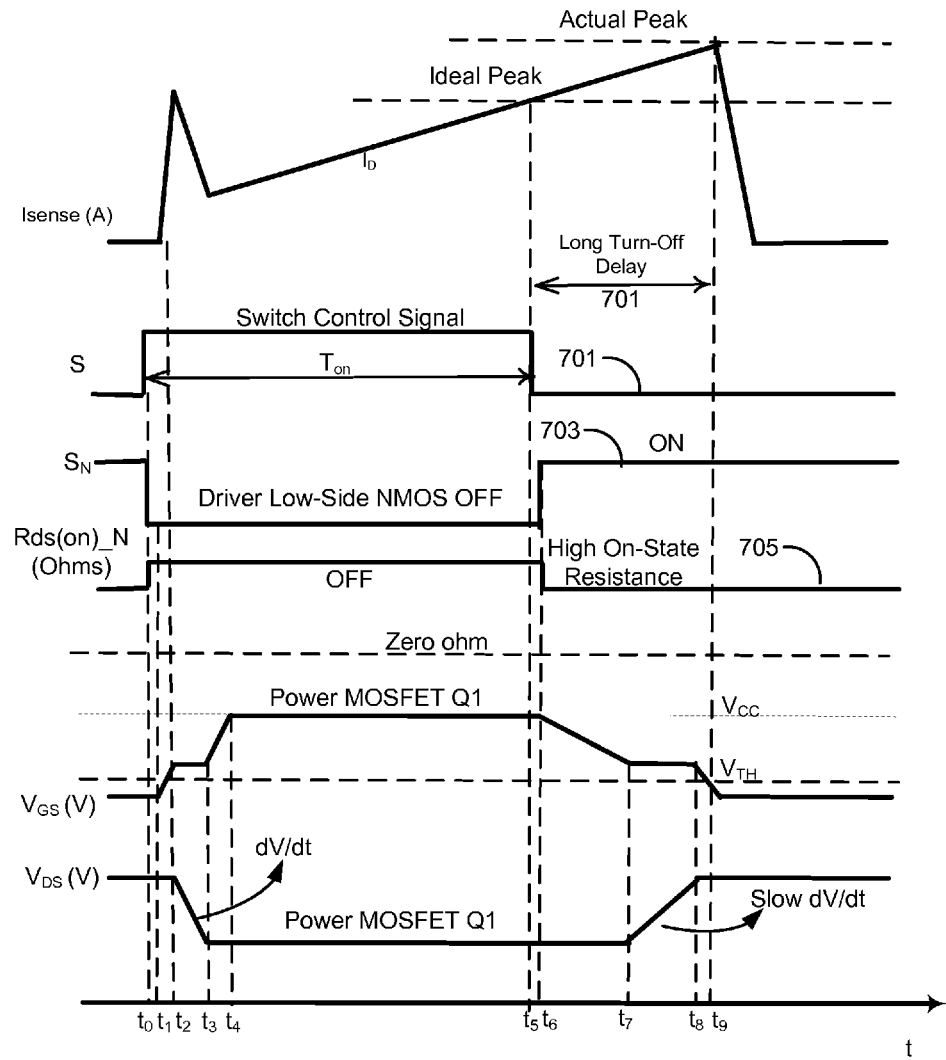
FIG. 7A illustrates switching waveforms of the conventional switching power converter when using a fixed high gate resistance in the gate driver at turn-off time.

FIG. 7A illustrates the conventional application of a fixed high on-state resistance Rds(on)_N during turn-off operation of MOSFET Q1 illustrated by time interval [$t_5$, $t_9$]. At time $t_5$, MOSFET Q1 is turned off shown by the switch control signal S going low 701. At time $t_6$, after a short time delay the gate driver signal $S_N$ is set to high 703 which turns on the low side NMOS $Q_N$ and a fixed high on-state resistance Rds(on)_N 705 is set. The use of the fixed high on-state resistance Rds(on)_N 705 results in a longer time delay between time interval [$t_6$, $t_7$]. During time interval [$t_7$, $t_8$] the fixed high on-state resistance slows the rate of voltage change of the drain-to-source voltage $V_{DS}$ of Q1 which reduces EMI. However, the slower rate of voltage change also increases the duration during interval [$t_7$, $t_8$]. Thus, the turn-off delay is further increased by using a fixed high on-state resistance Rds(on)_N during turn-off of Q1.

Figure 7B:
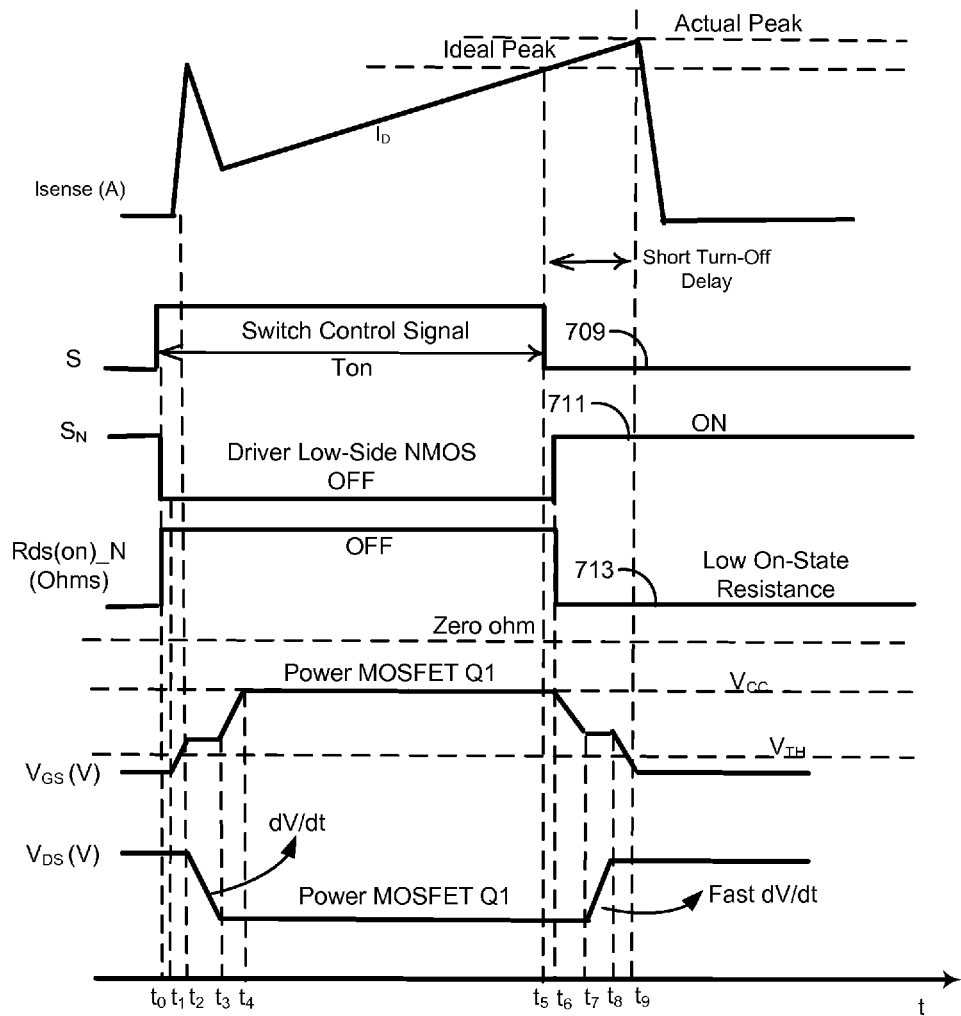
FIG. 7B illustrates switching waveforms of the conventional switching power converter when using a fixed low gate resistance in the gate driver at turn-off time.

FIG. 7B illustrates the application of a fixed low on-state resistance Rds(on)_N during turn-off operation of Q1 illustrated by time interval [$t_5$, $t_9$]. At time $t_5$, MOSFET Q1 is turned off shown by the switch control signal S going low 709. At time $t_6$, after a short time delay the gate driver signal $S_N$ is set to high 711 which turns on the low side NMOS $Q_N$ and a fixed low on-state resistance Rds(on)_N 713 is set. The use of the low on-state resistance Rds(on)_N 713 results in a shorter time delay between time interval [$t_6$, $t_7$]. However, during the time interval [$t_7$, $t_8$], the fixed low on-state resistance 713 results in a faster rate of change dV/dt of the drain-to-source voltage $V_{DS}$ of Q1. Thus, although the turn-off delay is decreased by using a low on-state resistance Rds(on)_N 713 during turn-off of Q1, the low on-state resistance Rds(on)_N 713 increases the rate of change of the drain-to-source voltage dV/dt resulting in increased EMI.

Figure 1:
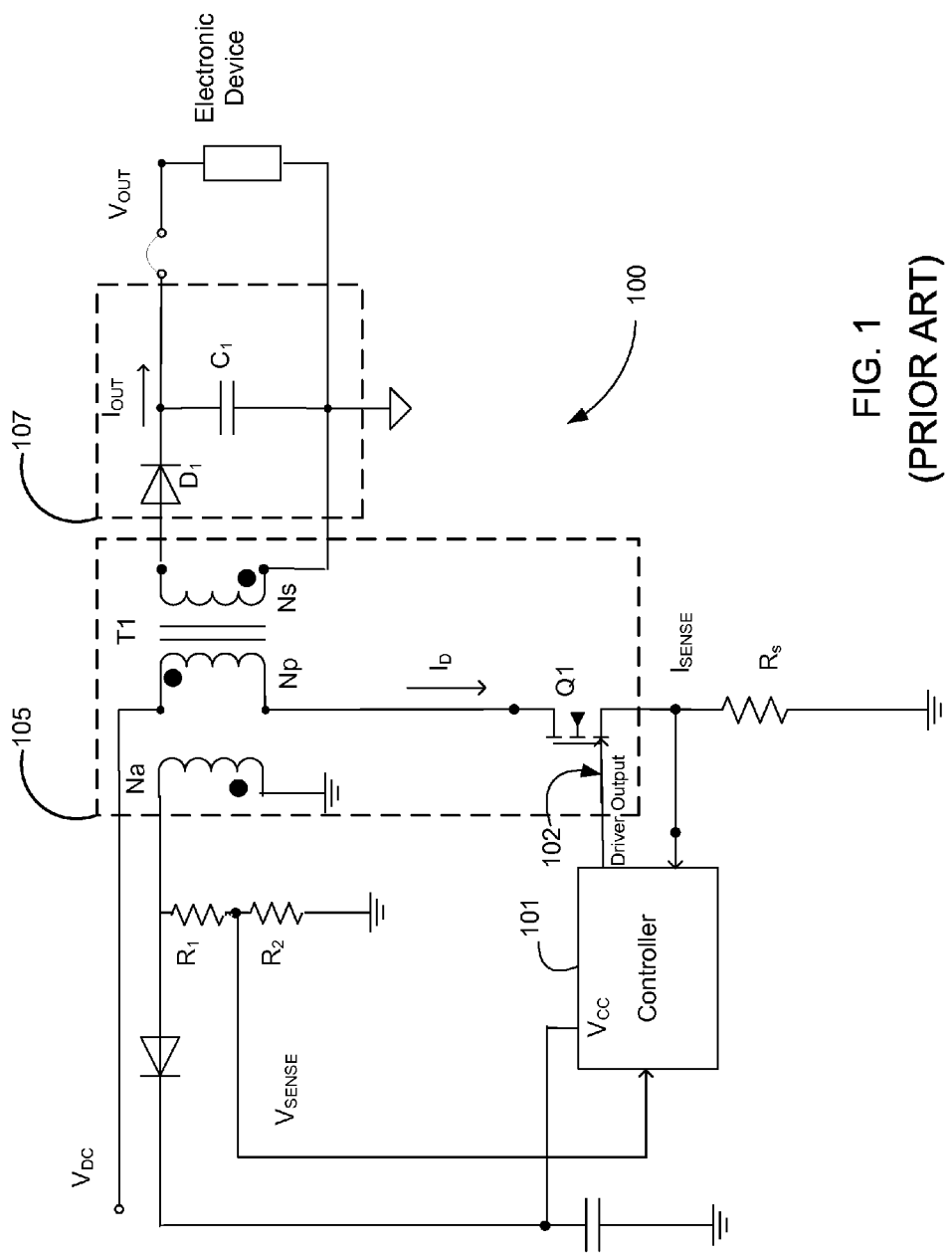
FIG. 1 illustrates a conventional switching power converter.
Figure 2:
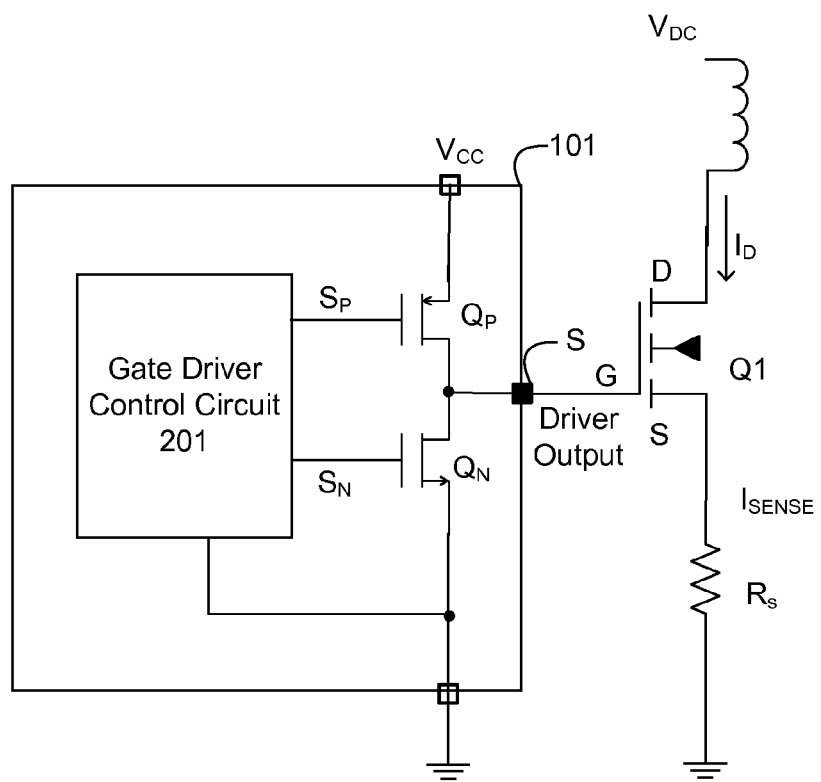
FIG. 2 illustrates a conventional gate driver configuration.
Figure 3:
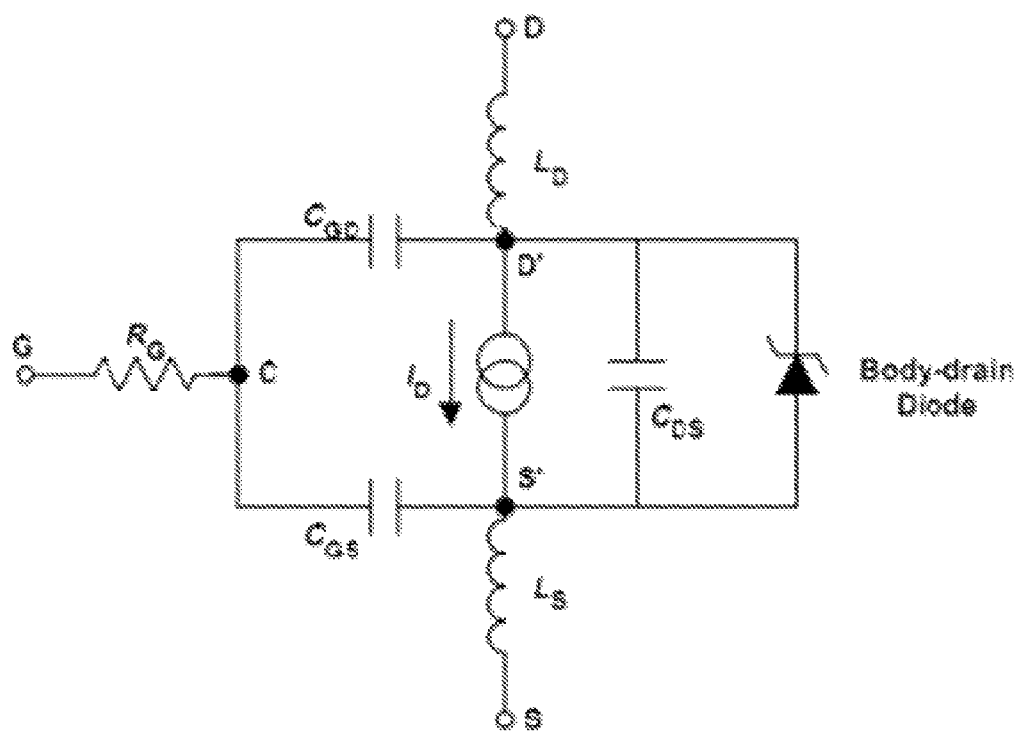
FIG. 3 illustrates a MOSFET circuit model.
Figure 8A:
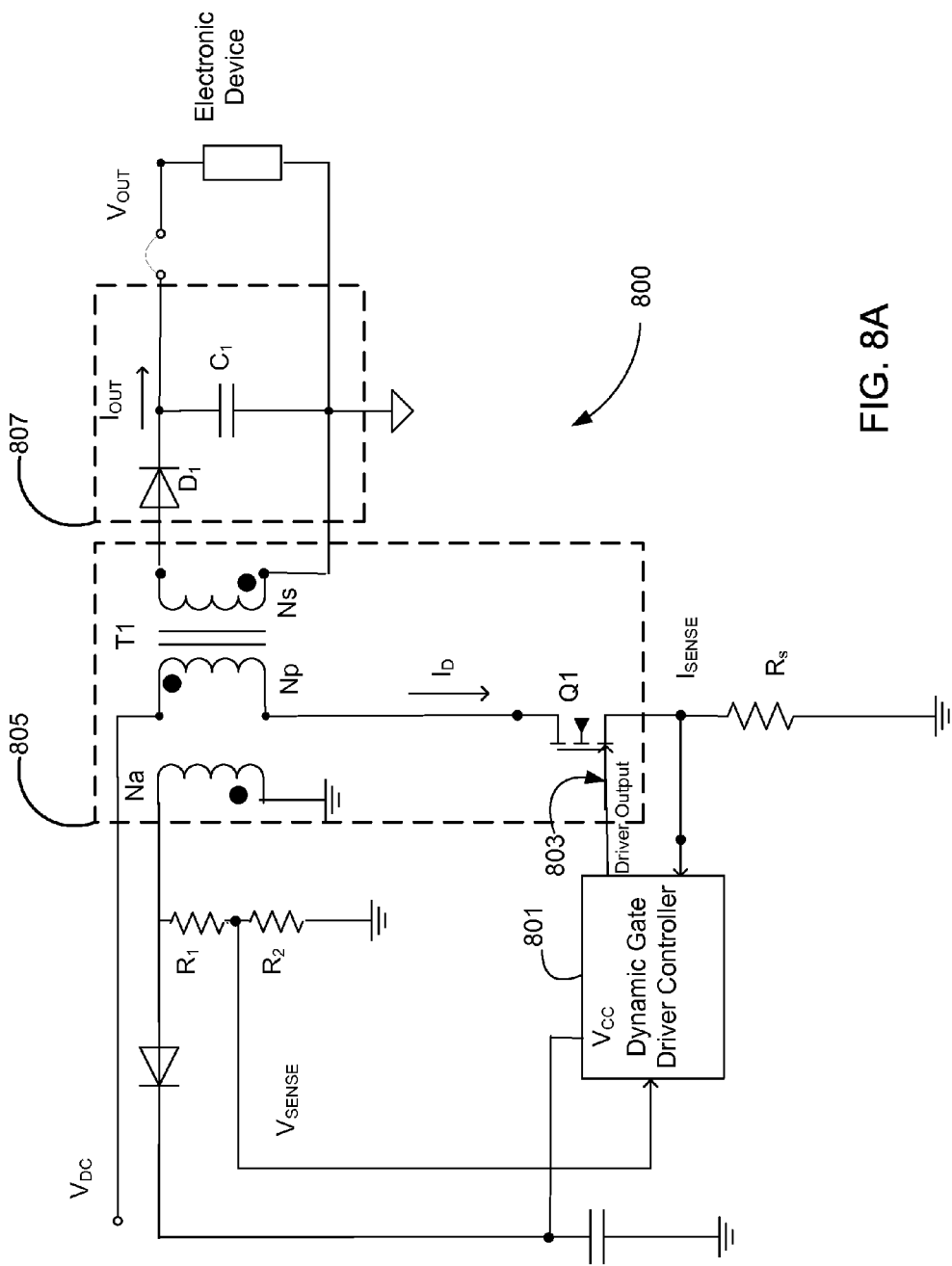
FIG. 8A illustrates a switching power converter according to one embodiment.

FIG. 8A illustrates a circuit diagram of a flyback type switching power converter 800 that uses a MOSFET Q1 according to one embodiment. The switching power converter 800 includes a power stage 805 and a secondary output stage 807 that perform similar functionality as the power stage 105 and secondary output stage 107 described with respect to FIG. 1.

The dynamic gate driver controller 801 of the switching power converter 800 generates appropriate switch drive pulses 803 to control the on-times and off-times of MOSFET Q1 and regulate the output voltage $V_{OUT}$. The dynamic gate driver controller 801 controls MOSFET Q1 using a feedback loop based on the sensed output voltage $V_{SENSE}$ and the sensed primary side current $I_D$ in previous switching cycles of the switching power converter, in a variety of operation modes including PWM (pulse width modulation) and/or PFM (pulse frequency modulation) modes. $I_{SENSE}$ is used to sense the primary current $I_D$ through the primary winding Np and switch Q1 in the form of a voltage across sense resistor $R_S$. In one embodiment, the dynamic gate driver controller 801 dynamically adjusts both the gate driver turn-on-resistance and the gate driver turn-off resistance within a single (i.e., one) switching cycle to reduce electromagnetic interference (EMI) in the system and to minimize the conduction loss of a power MOSFET during operation as will be further described below.

Figure 8B:
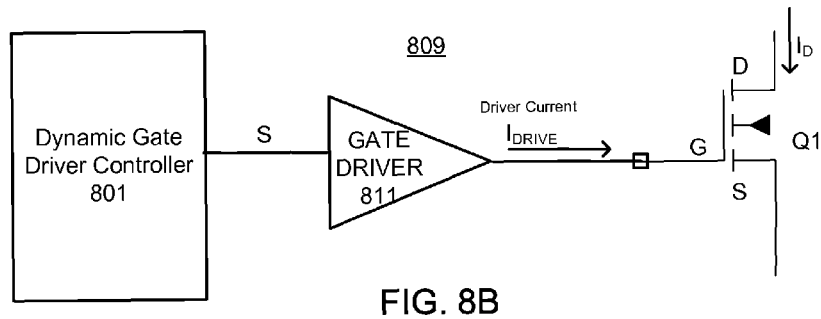
FIG. 8B illustrates a detailed view of a MOSFET gate driver system according to one embodiment.

FIG. 8B illustrates one embodiment of a dynamic gate driver configuration 809 to address the turn-on and turn-off issues described above by adjusting the driver current $I_{DRIVE}$ of the MOSFET Q1 during turn-on operation and the turn-off operation. As shown in FIG. 8B, the dynamic gate driver configuration 809 comprises the dynamic gate driver controller 801 that issues a switch control signal S to the gate driver 811. Based on the switch control signal S, the gate driver 811 dynamically adjusts the driver current $I_{DRIVE}$ within a single switching cycle of the plurality of switching cycle of a switching power converter 800 to turn-on and turn-off MOSFET Q1.

Figure 9:
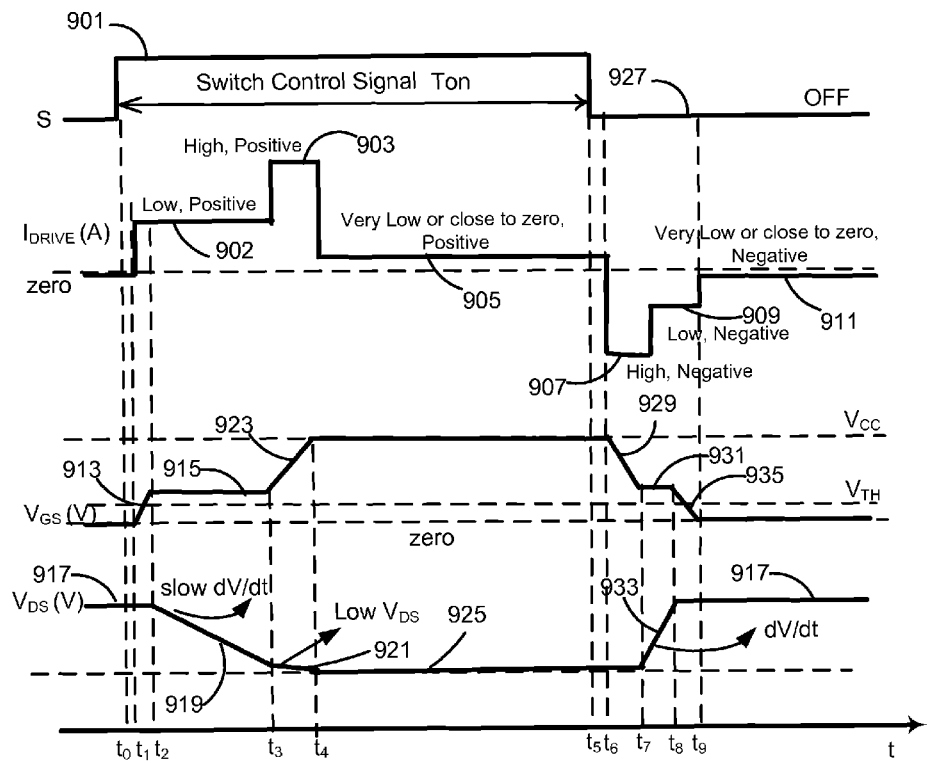
FIG. 9 illustrates switching waveforms of one embodiment of the MOSFET gate driver system shown in FIG. 8B during a single switching cycle.

FIG. 9 illustrates various switching waveforms of the dynamic gate driver configuration 809 during a single switching cycle of the switching power converter 800 according to one embodiment. Specifically, FIG. 9 illustrates over time the switch control signal S, the drive current $I_{DRIVE}$, the gate-to-source voltage $V_{GS}$ of MOSFET Q1, and the drain-to-source voltage $V_{DS}$ of MOSFET Q1 during the turn-on operation and the turn-off operation of the MOSFET Q1. At time $t_0$, the dynamic gate driver controller 801 turns on Q1 by issuing a high 901 switch control signal S. The duration in which the switch control signal S is high 901 represents the on-time $T_{on}$ of MOSFET Q1. After a short delay, at time $t_1$ the gate driver 811 sets the drive current $I_{DRIVE}$ to a first (low) current level 902 that is a positive value.

During the time interval [$t_1$ to $t_2$], the gate-to-source voltage $V_{GS}$ of Q1 rises 913 to a first voltage level 915 that is higher than the Q1 threshold voltage $V_{TH}$ and Q1 starts to conduct. During this period, the drain-to-source voltage $V_{DS}$ of Q1 maintains a high voltage 917, e.g., $V_{DS}=V_{DC}$. During the time interval [$t_2$, $t_3$], the gate-to-source voltage $V_{GS}$ of Q1 stays at the first voltage level 915. Furthermore, the drive current $I_{DRIVE}$ is maintained at the first current level 902. As shown in FIG. 9, the drain-to-source voltage $V_{DS}$ of Q1 decreases 919 during time interval [$t_2$, $t_3$]. Because the drive current $I_{DRIVE}$ is maintained at the first current level 902, the voltage rate of change of the drain-to-source voltage $V_{DS}$ of Q1 represented by dV/dt is slow thereby resulting in lower EMI.

At time $t_3$, the gate driver increases the gate drive current $I_{DRIVE}$ to a second current level 903 associated with a higher positive value than the first current level 902. During the time interval [$t_3$, $t_4$], the gate driver 811 maintains the gate drive current $I_{DRIVE}$ at the second current level 903. As shown in FIG. 9, during the time interval [$t_3$, $t_4$], the drain-to-source voltage $V_{DS}$ of Q1 decreases 921 to a low level 925 and the gate-to-source voltage $V_{GS}$ rises 923 and eventually reaches near $V_{CC}$. At time $t_4$, the gate driver 811 reduces the gate drive current $I_{DRIVE}$ to a third current level 905 that is a positive value that is very low or close to zero thereby completing the turn-on transition of Q1. During the time interval [$t_4$, $t_5$], the gate driver 811 maintains the gate drive current $I_{DRIVE}$ at the third current level 905. Furthermore, during the time interval [$t_4$, $t_5$], the drain-to-source voltage $V_{DS}$ of Q1 is maintained at the low level 925 and the gate-to-source voltage $V_{GS}$ is maintained at approximately $V_{CC}$.

Time interval [$t_5$, $t_9$] illustrates the turn-off operation for the dynamic gate driver configuration 809 which addresses the turn-off issues described above by adjusting the driver current $I_{DRIVE}$ of MOSFET Q1. At time $t_5$, the dynamic gate driver controller 801 turns off MOSFET Q1 shown by the switch control signal S going low 927. After a short time delay, at time $t_6$ the gate driver 811 adjusts (i.e., reduces) the driver current $I_{DRIVE}$ from the third current level 905 to a fourth current level 907 that represents a high negative value. During the time interval [$t_6$, $t_7$], the driver current $I_{DRIVE}$ is maintained at the fourth current level 907.

Furthermore, during the time interval [$t_6$, $t_7$], the gate-to-source voltage $V_{GS}$ of MOSFET Q1 decreases 929 from $V_{CC}$ to a value 931 above the threshold voltage $V_{TH}$ and the drain-to-source voltage $V_{DS}$ of MOSFET Q1 still stays at a low level 925. At time $t_7$, the driver current $I_{DRIVE}$ is increased to a fifth current level 909 that is greater than the fourth current level 907 but less than the third current level 905. In one embodiment, the fifth current level 909 is associated with a low negative value.

During the time interval [$t_7$, $t_8$], the driver current $I_{DRIVE}$ is maintained at the fifth current level 909 to reduce EMI and the turn-off delay of MOSFET Q1. As shown in FIG. 9, the gate-to-source voltage $V_{GS}$ of MOSFET Q1 is maintained at the value 931 (i.e., a plateau) during the time interval [$t_7$, $t_8$] and the drain-to-source voltage $V_{DS}$ rises 933 towards the high voltage 917 during the time interval [$t_7$, $t_8$] which is represented by dV/dt.

As shown in FIG. 9, the drain-to-source voltage $V_{DS}$ of MOSFET Q1 reaches the maximum DC voltage 917 and maintains the DC voltage 917 during the time interval [$t_8$, $t_9$]. Furthermore, the gate-to-source voltage $V_{GS}$ of MOSFET Q1 decreases 935 to zero during the time interval [$t_8$, $t_9$]. Once the gate-to-source voltage $V_{GS}$ falls below the threshold voltage $V_{TH}$, Q1 is turned off. At time $t_9$, the driver current $I_{DRIVE}$ is increased to a sixth current level 911 that is still negative but close to zero. The value associated with the sixth current level 911 is greater than the fourth current level 907 and fifth current level 909 but less than the value of the third current level 905. Thus, the turn-off transition is completed.

Turn-On Operation

Figure 10:
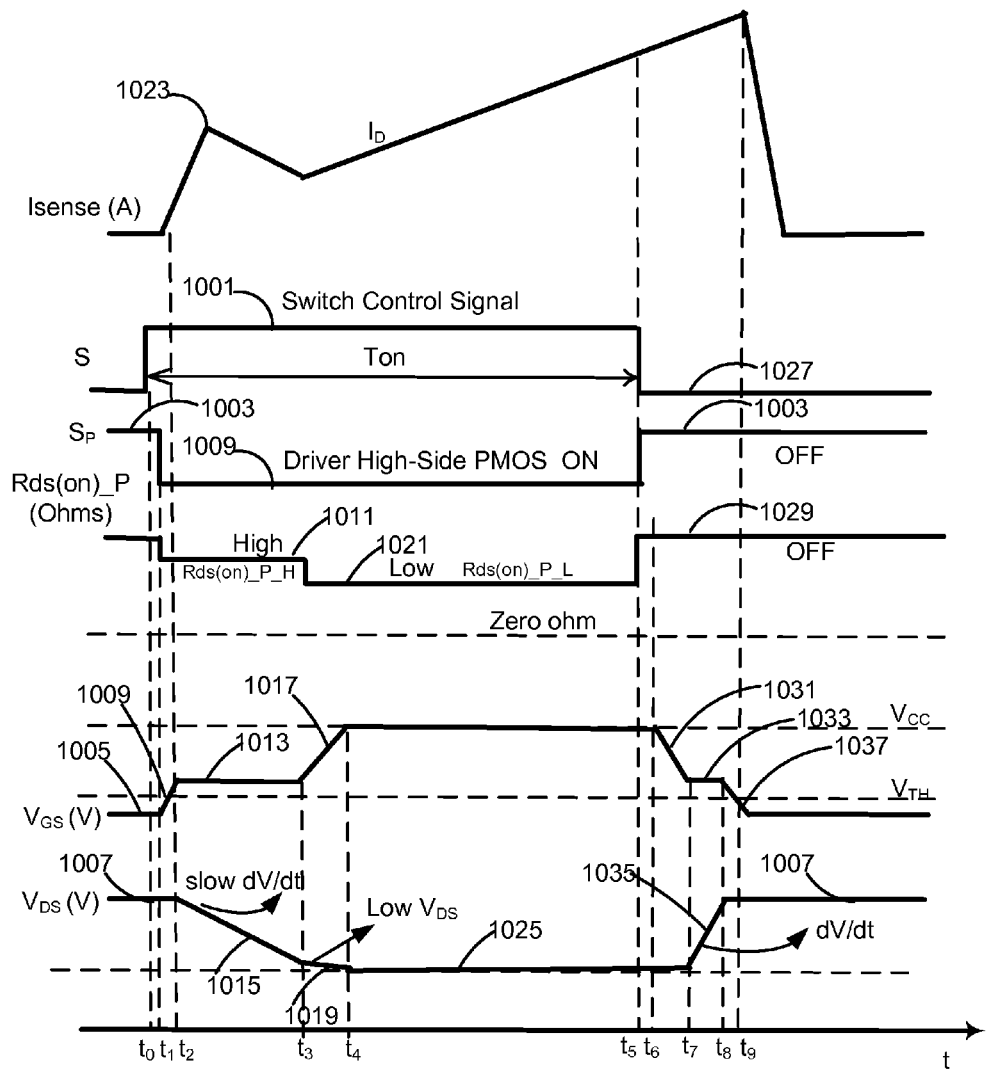
FIG. 10 illustrates switching waveforms of one embodiment of the dynamically adjusted gate resistance in the gate driver at on-time during a single switching cycle.

FIG. 10 illustrates one embodiment of how to vary the gate drive current $I_{DRIVE}$ during turn-on operation within a single switching cycle as discussed above with respect to FIG. 9 to address the turn-on issue, i.e. achieving slow dV/dt and low conduction loss at the same time. During the on-time $T_{on}$ within one switching cycle, the turn-on gate resistance Rg, which is the driver high-side PMOS on-state resistance Rds (on)_P is dynamically adjusted. Generally, at the initial turn-on, roughly from time interval [$t_0$, $t_3$], a high Rds(on)_P (namely Rds(on)_P_H) is used, which slows down the fall rate of the drain-to-source voltage $V_{DS}$ of Q1 from high DC voltage (such as 300V) toward zero thus reducing the dV/dt.

At time $t_0$, the dynamic gate driver controller 801 turns on Q1 by issuing a high 1001 switch control signal S. The duration in which the switch control signal S is high 1001 represents the on-time $T_{on}$ of MOSFET Q1. At time $t_0$, the driver high-side PMOS is off since the gate driver signal $S_P$ is high 1003. Because the driver high-side PMOS is off, the Rds(on)_P of the driver high-side PMOS is also off 1003 (i.e., an open switch). Furthermore, at time $t_0$, the gate-to-source voltage $V_{GS}$ is approximately zero 1005 and the drain-to-source voltage $V_{DS}$ of MOSFET Q1 is a high voltage 1007.

After a short delay, at time $t_1$ the gate driver 811 sets the gate driver signal Sp to low 1009 which turns on the high-side PMOS $Q_P$. During time interval [$t_1$, $t_2$], the gate-to-source voltage $V_{GS}$ rises 1009 above the threshold voltage $V_{TH}$ for MOSFET Q1 to a first voltage level 1013 causing Q1 to conduct and the drain-to-source voltage $V_{DS}$ of MOSFET Q1 still maintains a high voltage 1007. During time interval [$t_1$, $t_2$], the Rds(on)_P is switched to a high resistance 1011.

During time period [$t_2$, $t_3$], the Rds(on)_P of the high-side PMOS $Q_P$ remains high 1011. The high resistance 1011 slows the dV/dt of the drain-to-source voltage $V_{DS}$ during time period [$t_2$, $t_3$] thereby reducing EMI because the current spike in the primary current $I_D$ is reduced 1023. Furthermore, during time interval [$t_2$, $t_3$], the gate-to-source voltage $V_{GS}$ is maintained at a first voltage level 1013 and the drain-to-source voltage $V_{DS}$ decreases 1015 with the slower dV/dt due to the high 1011 Rds(on)_P of the high-side PMOS $Q_P$.

At time $t_3$, the gate-to-source voltage $V_{GS}$ of Q1 increases 1017 from the first voltage level 1013 towards $V_{CC}$ and the drain-to-source voltage $V_{DS}$ of Q1 drops 1019 to a significantly-low level, such as less than approximately 10V. In response, the Rds(on)_P is switched to a lower resistance (namely Rds(on)_P_L) 1021. The lower Rds(on)_P 1021 provides more drive current to quickly charge the gate-to-source voltage $V_{GS}$ of Q1 such that $V_{GS}$ can quickly ramp (i.e., increase) to $V_{CC}$ at time $t_4$. Thus, the time interval [$t_3$, $t_4$] is reduced (i.e., becomes shorter), and the drain-to-source voltage $V_{DS}$ is reduced 1019. As a result, the conduction loss is reduced and efficiency is improved.

During the time interval [t4, t5], the gate-to-source voltage VGS of Q1 is maintained near $V_{CC}$ and the drain-to-source voltage VDS of Q1 is maintained at a low level 1025. Furthermore, the Rds(on)_P is maintained at the lower resistance Rds(on)_P_L 1021. At time t5, the dynamic gate driver controller 801 turns off the Q1 by issuing a low 1027 switch control signal S and turns off the high-side PMOS by issuing a high 1003 gate driver signal SP. Because the high-side PMOS is turned off, the Rds(on)_P is switched off 1029. During time interval [t6, t7], the gate-to-source voltage VGS of Q1 decreases 1031 from VCC to a second level 1033 and the drain-to-source voltage VDS is maintained at the low level 1025. At time t7, the gate-to-source voltage VGS of Q1 has fallen to the second level 1033 and the drain-to-source voltage VDS has increased 1035 from the low level 1025. During time interval [t7, t8], the gate-to-source voltage VGS of Q1 is maintained at the second level 1033 and the drain-to-source voltage VDS keeps increasing 1035 until the high voltage 1007 is reached at time t8. During time interval [t8, t9], the gate-to-source voltage VGS of Q1 decreases 1037 below the threshold voltage VTH interval until reaching approximately zero voltages at time t9.

Figure 11:
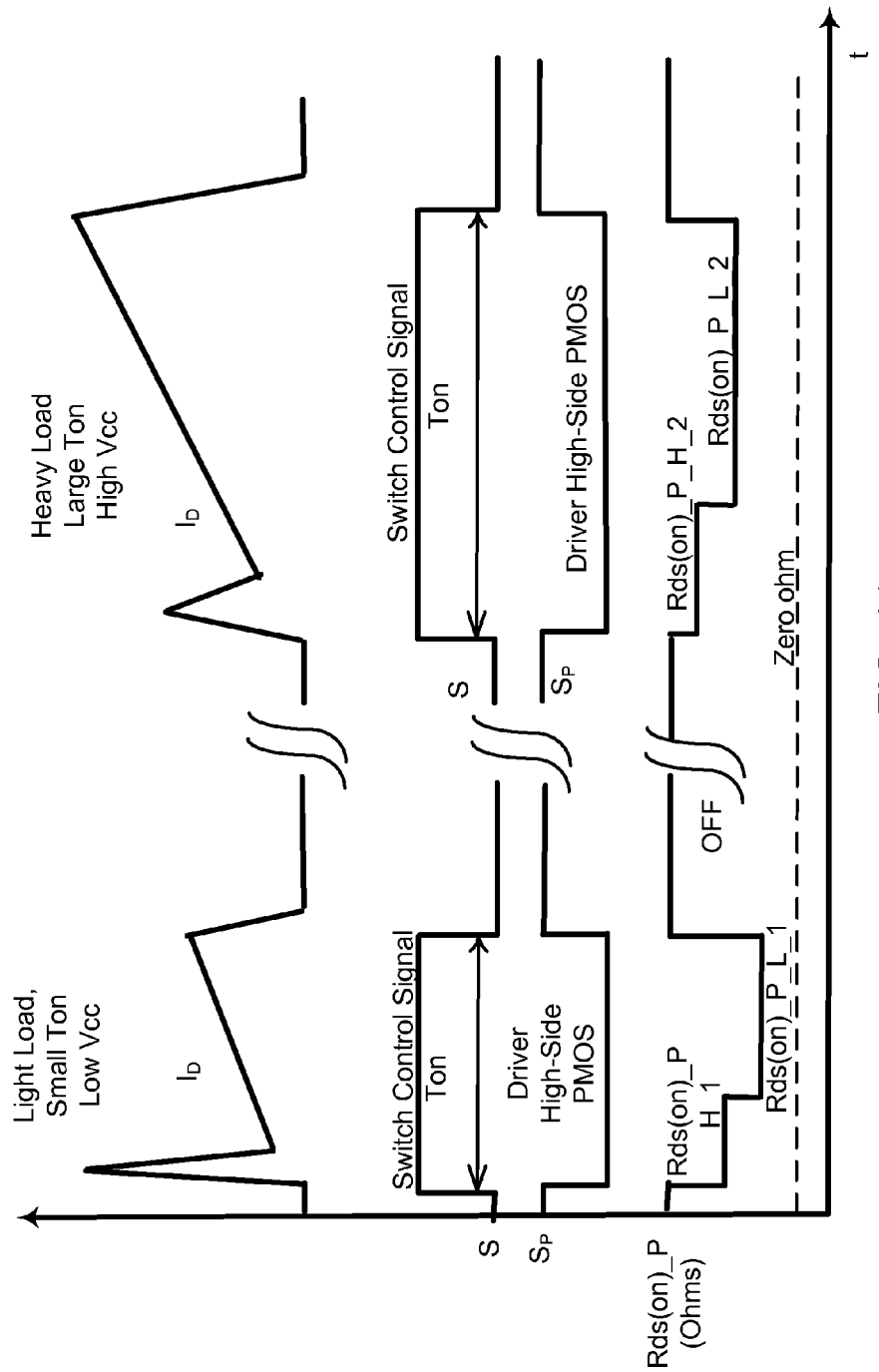
FIG. 11 illustrates switching waveforms of one embodiment of the dynamically adjusted gate resistance in the gate driver based on power supply operation load conditions.

FIG. 11 illustrates how the high on-resistance Rds(on)_P_H and the low on-resistance Rds(on)_P_L can be adjusted based on load, $T_{on}$ and/or $V_{CC}$ changes during the entire power supply operation range. For example, under the light load condition, the on-time $T_{on}$ normally is small, or Vcc is lower, so smaller values of Rds(on)_P_H (e.g., Rds(on)_P_H_1) and Rds(on)_P_L (e.g., Rds(on)_P_L_1) are used compared to the values used during heavy load conditions (e.g., Rds(on)_P_H_2 and Rds(on)_P_L_2). By using smaller values of Rds(on)_P_H and Rds(on)_P_L under the light load condition, the speed of the turn-on transition of Q1 is increased and the effective duty-cycle loss reduced when facing the small on-time $T_{on}$, while a relatively high dV/dt can be justified since the absolute peak current is small and total EMI noise is small under the light load conditions. On the other hand, larger values of Rds(on)_P_H (e.g., Rds(on)_P_H_2) and Rds(on)_P_L (e.g., Rds(on)_P_L_2) can be used under the heavy load, large on-time $T_{on}$ or high $V_{CC}$ conditions.

Figure 12A:
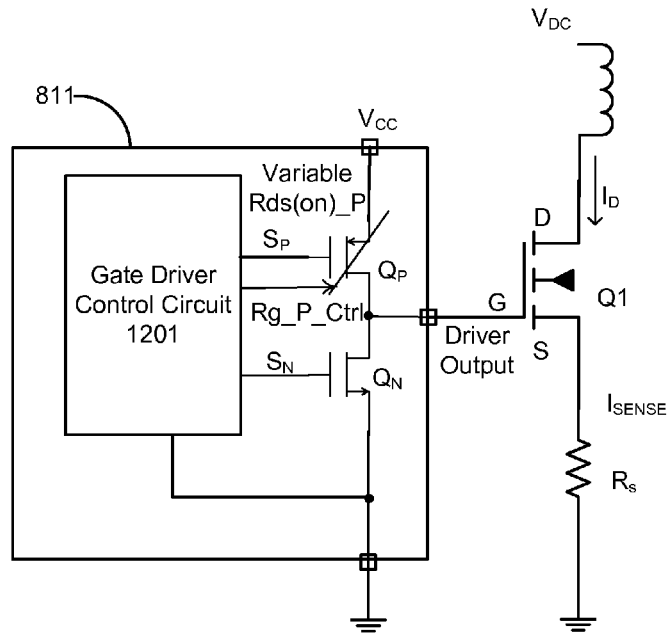
FIG. 12A illustrates a dynamic gate driver with variable on-resistance of the high side MOSFET according to one embodiment.

FIG. 12A illustrates one embodiment of a gate driver 811 to implement variable on-resistance to improve the turn-on operation. A controller comprises a gate driver control circuit 1201 coupled to a driver final stage including a variable Rds(on) of the high-side PMOS $Q_P$ and a low-side NMOS $Q_N$. The high-side PMOS source is connected to $V_{CC}$, and the low-side NMOS source is connected to ground (GND). The gate driver control circuit 1201 generates the driver signals $S_P$ and $S_N$ respectively for the PMOS and the NMOS which control the driver output to MOSFET Q1.

Figure 12B:
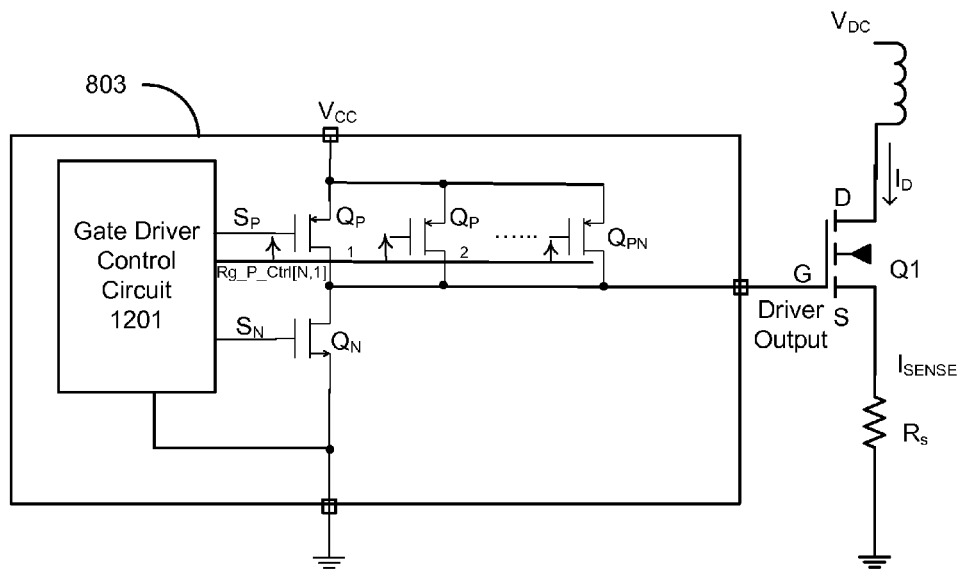
FIG. 12B illustrates a detailed view of the dynamic gate driver with variable on-resistance of the high side MOSFET according to one embodiment.

FIG. 12B illustrates one embodiment of the implementation of the variable Rds(on) of the high-side PMOS $Q_P$ from FIG. 12A. In one embodiment, a plurality of PMOS ($Q_{P1}$ to $Q_{PN}$) in parallel are used to implement the variable Rds(on)_P where the Rds(on) of each PMOS may or may not be equal. Each PMOS has a dedicated control signal (Rg_P_Ctrl[N:1]) to turn the PMOS ON/OFF. The Rg_P_Ctrl bit can be set by the gate driver control circuit 1201 based on the dynamic control scheme as mentioned above with respect to FIG. 10 and FIG. 11. With different combinations of Rds(on) of each PMOS, the actual equivalent Rds(on)_P at turn-on can be adjusted.

Within the on-time $T_{on}$ of one switching cycle, there are various embodiments to achieve the transition from Rds(on)_P_H to Rds(on)_P_L. One embodiment is based on open-loop control. In one embodiment, a predetermined time delay from time $t_0$ of FIG. 10 is set and a timer is enabled at time $t_0$. Once the timer reaches the predetermined threshold, Rds(on)_P is switched from high (Rds(on)_P_H) 1011 to low (Rds(on)_P_L) 1021. This time delay can be determined based on the targeted MOSFET characteristics and application circuit designs.

Figure 13A:
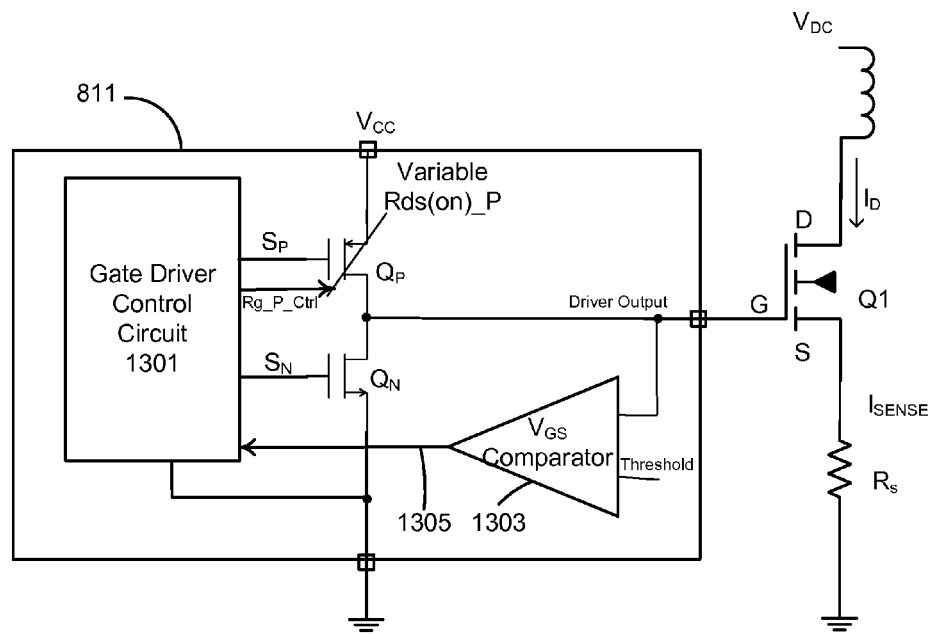
FIG. 13A illustrates a detailed view of a dynamic gate driver with variable on-resistance of the high side MOSFET that uses a comparator to detect the turn-on and turn-off delay according to one embodiment.
Figure 13B:
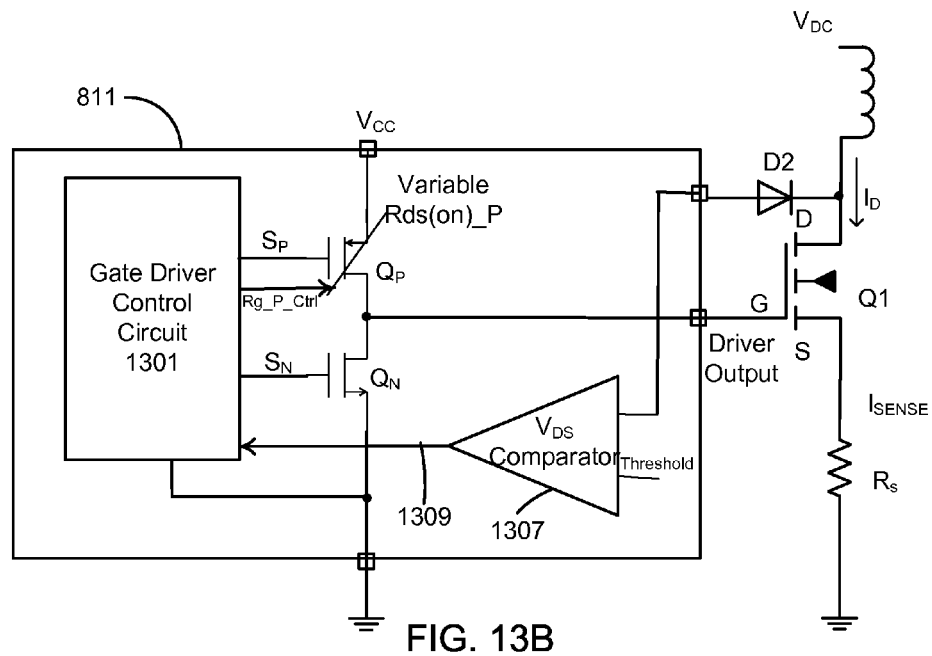
FIG. 13B illustrates a detailed view of a dynamic gate driver with variable on-resistance of the high side MOSFET that uses a comparator to detect the turn-on and turn-off delay according to one embodiment.

In another embodiment, achieving the transition from the high Rds(on)_P_H 1011 to the low Rds(on)_P_L 1021 is based on a closed-loop control, as shown in FIG. 13A and FIG. 13B. In FIG. 13A, the gate driver 811 comprises a gate driver control circuit 1301 similar to the gate driver control circuit 1201 shown in FIG. 12A and FIG. 12B. The gate driver 811 further comprises a $V_{GS}$ comparator 1303 with inputs including the gate-to-source voltage $V_{GS}$ of Q1 and a threshold value. In one embodiment, the threshold value is higher than the typical gate-to-source voltage $V_{GS}$ first voltage level 1013 (i.e., the plateau voltage) during time interval [t2, t3] for the target MOSFETs, but much lower than $V_{CC}$. Responsive to the gate-to-source voltage $V_{GS}$ of Q1 rising above the threshold value $V_{TH}$, the comparator 1303 is set and sends out a control signal 1305 to the gate driver control circuit 1301 to switch Rds(on)_P from high (Rds(on)_P_H) 1011 to low (Rds(on)_P_L) 1021.

In the embodiment shown in FIG. 13B, the gate driver 811 comprises the gate driver control circuit 1301 and a $V_{DS}$ comparator 1307 with inputs including the drain-to-source voltage $V_{DS}$ of Q1 and a threshold value. In one embodiment, the threshold value is at a significantly low level such that the fast dV/dt will not cause high noise, such as less than around 10V. Responsive to the drain-to-source voltage $V_{DS}$ of Q1 falling below the threshold value, the $V_{DS}$ comparator 1307 is set and sends a control signal 1309 to the gate driver control circuit 1301 to switch Rds(on)_P from high (Rds(on)_P_H) 1011 to low (Rds(on)_P_L) 1021. In FIG. 13B, an external diode D2 coupled to the drain of Q1 and the input of the $V_{DS}$ comparator 1307 may be used to block high voltage to the $V_{DS}$ comparator 1307.

Turn-Off Operation

Referring back to FIG. 4, during the turn-off transition interval [$t_5$, $t_9$] of a conventional switching power converter, the MOSFET Q1 should be turned off at time $t_5$, but the MOSFET Q1 does not turn-off until time $t_9$. This represents a turn-off delay. As a result, the drain current peak is increased from the ideal peak at time $t_5$ to the actual peak at time $t_9$ resulting in the generation of excess energy. In some applications, such as battery chargers and light emitting diodes (LEDs) lighting where tight current regulation is required, this excess energy will degrade control performance.

In addition, the turn-off delay can vary with different MOSFETs, because different MOSFETs have different characteristics. The varying excess energy causes variations in the system performance, tolerance and yield. On the other hand, reducing the performance variation cannot be done without sacrificing efficiency, EMI or increasing system cost (using specific MOSFETs can reduce the variation, but with increased component cost).

The delay from time interval [$t_5$, $t_6$] is normally insignificant. The majority of the delay occurs from time interval [$t_6$, $t_9$]. For a given power MOSFET with given input capacitor, increasing the drive current at turn-off can reduce the turn-off delay. This can be achieved by reducing the on-state resistance Rds(on)_N of the drive low-side NMOS $Q_N$, because $Q_N$ provides the discharge path for the gate-to-source voltage $V_{GS}$ of Q1 during turn-off. However, if the on-state resistance Rds(on)_N is too small, the drain-to-source voltage $V_{DS}$ of Q1 rises during time interval [$t_7$, $t_8$], which causes a high dV/dt resulting in increased EMI noise. Most conventional gate drivers use fixed gate resistance Rg at turn-off which is associated with the on-resistance Rds(on)_N within one switching cycle. However, this cannot solve the issue of slow dV/dt and small turn-off delay at the same time.

Figure 14:
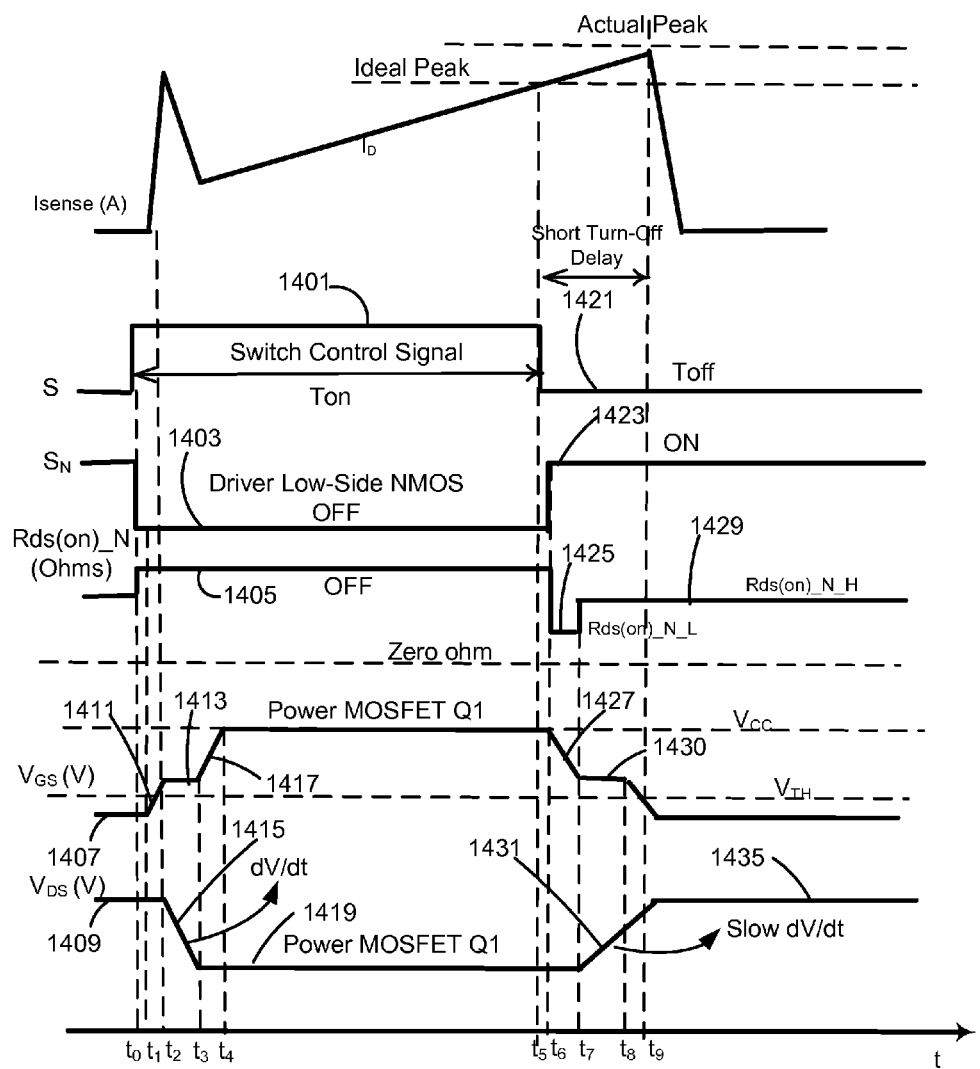
FIG. 14 illustrates switching waveforms of one embodiment of the dynamically adjusted gate resistance in the gate driver at turn-off time during a single switching cycle.

FIG. 14 illustrates one embodiment of how to vary the gate drive current $I_{DRIVE}$ during the turn-off operation within a single switching cycle by varying the Rds(on) of the low side NMOS $Q_N$ (as discussed above with respect to FIG. 9) to address the turn-off issue i.e. achieving slow dV/dt and short turn-off delay at the same time.

At time $t_0$, the dynamic gate driver controller 801 turns on Q1 by issuing a high 1401 switch control signal S. The duration in which the switch control signal S is high 1401 represents the on-time $T_{on}$ of MOSFET Q1. At time $t_0$, the dynamic gate driver controller 801 turns the driver low-side NMOS off by issuing a low 1403 gate driver signal $S_N$. Because the driver low-side NMOS is off, the Rds(on)_N of the driver low-side NMOS is also off 1405 (i.e., an open switch). Furthermore, at time $t_0$, the gate-to-source voltage $V_{GS}$ is approximately zero 1407 and the drain-to-source voltage $V_{DS}$ of MOSFET Q1 is a high voltage 1409.

After a short delay, at time $t_1$ the dynamic gate driver controller 801 maintains the gate driver signal $S_N$ to low 1403 which keeps the low-side NMOS $Q_N$ off. During time interval [$t_1$, $t_2$], the gate-to-source voltage $V_{GS}$ rises 1411 above the threshold voltage $V_{TH}$ for MOSFET Q1 to a first voltage level 1413 causing Q1 to conduct. The drain-to-source voltage $V_{DS}$ of MOSFET Q1 still maintains a high voltage 1409 during time interval [$t_1$, $t_2$]. During time interval [$t_1$, $t_2$], the Rds(on)_N is still off 1405.

During time period [$t_2$, $t_3$], the Rds(on)_N of the low-side NMOS $Q_N$ remains off 1405 as the gate driver signal $S_N$ remains low 1403. Furthermore, during time interval [$t_2$, $t_3$], the gate-to-source voltage $V_{GS}$ is maintained at the first voltage level 1413 and the drain-to-source voltage $V_{DS}$ decreases 1415. At time $t_3$, the gate-to-source voltage $V_{GS}$ of Q1 increases 1417 from the first voltage level 1413 to $V_{CC}$ and the drain-to-source voltage $V_{DS}$ of Q1 decreases 1415 to a significantly-low level 1419, such as less than approximately 10V. During time period [$t_4$, $t_5$], the gate-to-source voltage $V_{GS}$ of Q1 is maintained at $V_{CC}$ and the drain-to-source voltage $V_{DS}$ of Q1 is maintained at the low level 1419. The Rds(on)_N of the low-side NMOS $Q_N$ remains off 1405 during time period [$t_4$, $t_5$] as the gate driver signal $S_N$ remains low 1403.

At time $t_5$, the switch control signal S is set to low 1421 signifying the turn off of Q1. During the switch off time $T_{off}$ within one switching cycle, the turn-off gate resistance Rg, which is the driver low-side NMOS on-state resistance Rds(on)_N, is dynamically adjusted. After a short delay, at time $t_6$, the gate driver signal $S_N$ transitions high 1423 thereby turning on the driver low-side NMOS $Q_N$. The driver low-side NMOS $Q_N$ turning on causes the implantation of a low 1425 Rds(on)_N (namely Rds(on)_N_L), which provides fast discharge of the gate-to-source voltage $V_{GS}$ of Q1 from $V_{CC}$ to the plateau during time interval [$t_6$, $t_7$].

During time interval [$t_6$, $t_7$], the gate-to-source voltage $V_{GS}$ of Q1 decreases 1427 from VCC to a second level 1430 and the drain-to-source voltage $V_{DS}$ is maintained at the low level 1419. As shown in FIG. 14, the reduction of the time interval [$t_5$, $t_7$] reduces the total turn-off delay, but does not increase the rate of voltage change dV/dt of the drain-to-source voltage of Q1. At time $t_7$, the gate-to-source voltage $V_{GS}$ of Q1 has fallen to the second level 1429 and the drain-to-source voltage $V_{DS}$ has increased 1431 from the significantly-low level 1419, such as above around 10V. Furthermore, at time $t_7$, Rds(on)_N is switched to a higher resistance 1429 (namely Rds(on)_N_H). During time interval [$t_7$, $t_8$], the gate-to-source voltage $V_{GS}$ of Q1 is maintained at the second level 1429 and the drain-to-source voltage $V_{DS}$ keeps increasing 1431. Additionally, the Rds(on)_N is maintained at the higher resistance 1429. In designs where EMI is of the most concern, the higher Rds(on)_N_H can slow down the rate of voltage change dV/dt when the drain-to-source voltage $V_{DS}$ is ramping 1431 from low level 1419 to high DC voltage 1435 such as 300V at time period $t_9$.

Similar to the turn-on operation, during the entire power supply operation range, the Rds(on)_N_H and Rds(on)_N_L can be adjusted based on load, Ton and/or VCC changes. Also, there are various ways to implement the variable steps of Rds(on)_N. One embodiment implements a plurality of NMOSs in parallel, and their Rds(on) can be equal or not equal as described with respect to FIG. 12B for the variable on-resistance of the high side PMOS. Each NMOS comprises a dedicated control signal Rg_N_Ctrl[N:1] to turn the NMOS on or turn the NMOS off. The Rg_N_Ctrl bit can be set based on the dynamic control scheme as mentioned above. With different combinations of Rds(on) of each NMOS, the actual equivalent Rds(on)_N at turn-off can be adjusted.

Within the off time $T_{off}$ of one switching cycle, there are different ways to achieve the transition from Rds(on)_N_L to Rds(on)_N_H. One embodiment is based on open-loop control—a predetermined time delay from time $t_5$ shown in FIG. 14 is set and a timer is enabled at time $t_5$. Once the timer reaches the predetermined threshold, Rds(on)_N is switched from low 1425 to high 1429. This time delay can be determined based on the targeted MOSFET characteristics and application circuit designs. The other embodiment is based on closed-loop control.

Similar to the variable on-resistance of high side PMOS, to achieve the transition from Rds(on)_N_L 1425 to Rds(on)_N_H 1429, a driver comprises a comparator with inputs including the gate-to-source voltage $V_{GS}$ of Q1 and a threshold value similar to the configuration illustrated in FIG. 13A. In one embodiment, the threshold value is the typical $V_{GS}$ plateau voltage during time interval [$t_7$, $t_8$] for the target MOSFETs, but higher than the Q1 threshold $V_{TH}$. Responsive to the gate-to-source voltage $V_{GS}$ of Q1 rising above the threshold value, the comparator is set and sends out a control signal to switch Rds(on)_N from L to H.

In one embodiment, to achieve the transition from Rds(on)_N_L to Rds(on)_N_H, a driver comprises a comparator with inputs including the drain-to-source voltage $V_{DS}$ of Q1 and a threshold value similar to the configuration illustrated in FIG. 13B. In one embodiment, the threshold is a value that indicates that MOSFET Q1 starts to go into the plateau region and is a value substantially higher than the $V_{DS}$ voltage during the on-time $T_{on}$, but much lower than the high DC voltage (~300V and above). Responsive to the drain-to-source voltage $V_{DS}$ rising above the threshold value, the comparator is set and sends a control signal to switch Rds(on)_N from low to high.

Further, the dynamic gate driver control can reduce the turn-off delay, but does not completely remove the turn-off delay. In case the turn-off delay is still a concern, such as when very tight current regulation is required, the embodiments herein introduces real-time turn-off delay measurement into the MOSFET gate drivers by utilizing the $V_{GS}$ and/or $V_{DS}$ comparators previously described above with respect to FIG. 13. In one embodiment, a timer is started at time $t_5$ of FIG. 14 when the controller decides to turn-off Q1, and the timer is reset based on either the gate-to-source voltage $V_{GS}$ comparator or the drain-to-source voltage $V_{DS}$ comparator. For the $V_{GS}$ comparator, once the gate-to-source voltage $V_{GS}$ falls below a threshold, which is below the threshold $V_{TH}$ for Q1 but higher than zero volts such that the signal can be easily detected, the comparator is set and sends out a control signal to reset the timer and retrieve the turn-off delay information that can be used for compensation purposes. For the $V_{DS}$ comparator, once the drain-to-source voltage $V_{DS}$ rises above a threshold, which is close or higher than the high DC voltage (for 300V DC voltage, the threshold can be around 300V), the comparator is set and sends a control signal to reset the timer and get the turn-off delay information.

Figure 15:
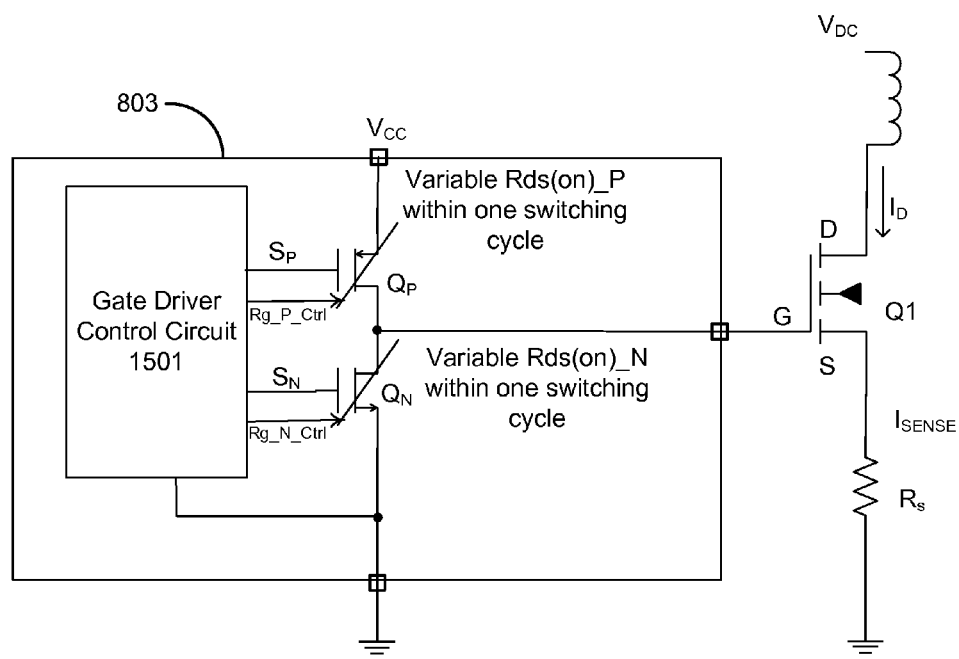
FIG. 15 illustrates a detailed view of one embodiment of a dynamic gate driver comprising variable on-resistance of the high side MOSFET and variable on-resistance of the low side MOSFET.

Combining the turn-on and turn-off architecture and control scheme forms a complete dynamic MOSFET gate driver 811 comprising the gate driver control circuit 1501, a PMOS $Q_P$ having a variable on-resistance, and a low side NMOS $Q_N$ having a variable on-resistance as shown in FIG. 15. The dynamic MOSFET gate driver 803 can reduce the rate of change dV/dt of the drain-to-source voltage at both turn-on operation and turn-off operations, improve the conduction loss, reduce the turn-off delay time, and real-time measure the delay time for computation and control compensation. Without compromising the EMI performance, the improved conduction loss will not only improve the power supply efficiency, but also enhance the thermal capability and manufacturability of electronics equipments. The improved turn-off delay time, together with the real-time sensing and compensation, will ensure the power supply system perform more consistently under varying component characteristics and operation conditions.

Manufacturing Yield and Component Selectivity

By using variable resistances during turn-on operation and turn-off operation as described above, manufacturability of power supplies can be improved due to the adaptive nature of the control scheme. Moreover, component selection can be widened to accommodate for the variability in the electrical characteristics.

It should be mentioned although in FIG. 9 the different gate drive current $I_{DRIVE}$ levels are drawn as straight lines for the illustration purpose, it is not necessarily to implement the $I_{DRIVE}$ levels at strict current levels in the actual circuit designs (which normally means tightly-controlled constant current sources), as long as there are substantial difference in amplitude and direction among the different levels. In addition to MOSFETs, this dynamic gate driver system architecture and control scheme will be used in other types of gate-controlled power semiconductor switching devices such as IGBTs.

Upon reading this disclosure, those of skill in the art will appreciate still additional alternative designs for detecting no load conditions in a switching power converter and operating the switching power converter under no load conditions. Thus, while particular embodiments and applications have been illustrated and described, it is to be understood that the embodiments discussed herein are not limited to the precise construction and components disclosed herein and that various modifications, changes and variations which will be apparent to those skilled in the art may be made in the arrangement, operation and details of the method and apparatus disclosed herein without departing from the spirit and scope of the disclosure.

What is claimed is:

1. A switching power converter comprising:
   a transformer including a primary winding coupled to an input voltage and a secondary winding coupled to an output of the switching power converter;
   a field effect transistor switch coupled to the primary winding of the transformer, current through the primary winding being generated while the field effect transistor switch is turned on and not being generated while the field effect transistor switch is turned off; and a driver control circuit configured to generate a control signal to turn on or turn off the field effect transistor switch during a plurality of switching cycles of the field effect transistor switch, each of the switching cycles including a first part during which the field effect transistor switch is turned on and a second part during which the field effect transistor switch is turned off, and the driver control circuit adjusting a magnitude of current of the control signal from a first level during a first duration of the first part of at least one of the switching cycles of the field effect transistor switch to a second level that is greater than the first level during a second duration of the first part of said one of the switching cycles, said second duration being later in time than said first duration.

2. The switching power converter of claim 1, wherein the driver control circuit adjusts the magnitude of current of the control signal from a first level during an earlier period of the second part of said one of the switching cycles to a second level during a later period of the second part of said one of the switching cycles.

3. The switching power converter of claim 1, wherein the driver control circuit comprises:
a first field effect transistor having variable on-resistance;
a second field effect transistor coupled in series to the first field effect transistor and also having variable on-resistance;
wherein a gate of the field effect transistor switch is coupled to a node between the first field effect transistor and the second field effect transistor,
the on-resistance of the first field effect transistor is adjusted to adjust the magnitude of current of the control signal during the first part of said at least one switching cycle, and
the on-resistance of the second field effect transistor is adjusted to adjust the magnitude of current of the control signal during the second part of said at least one switching cycle.

4. The switching power converter of claim 3, wherein the driver control circuit adjusts the on-resistance of the first field effect transistor from a first resistance to a second resistance during the first part of said at least one switching cycle responsive to a timer reaching a predetermined time threshold from when the field effect transistor switch is turned on, and wherein the driver control circuit adjusts the on-resistance of the second field effect transistor from a third resistance to a fourth resistance during the second part of said at least one switching cycle responsive to the timer reaching a predetermined time threshold from when the field effect transistor switch is turned off.

5. The switching power converter of claim 4, wherein the driver control circuit adjusts the on-resistance of the first field effect transistor from the first resistance to the second resistance during the first part of said at least one switching cycle responsive to a gate-to-source voltage of the field effect transistor switch passing a threshold value during the first part of said one of the switching cycles.

6. The switching power converter of claim 4, wherein the driver control circuit adjusts the on-resistance of the first field effect transistor from the first resistance to the second resistance during the first part of said at least one switching cycle responsive to a drain-to-source voltage of the field effect transistor passing a threshold value during the first part of said one of the switching cycles.

7. The switching power converter of claim 3, wherein the driver control circuit adjusts the on-resistance of the second field effect transistor from a third resistance to a fourth resistance during the second part of said at least one switching cycle responsive to a gate-to-source voltage of the field effect transistor passing a threshold value during the second part of said at least one switching cycle.

8. The switching power converter of claim 3, wherein the driver control circuit adjusts the on-resistance of the second field effect transistor from a third resistance to a fourth resistance during the second part of said at least one switching cycle responsive to a drain-to-source voltage of the field effect transistor passing a threshold value during the second part of said at least one switching cycle.

9. In a driver control circuit, a method of controlling a switching power converter, the switching power converter including a transformer with a primary winding coupled to an output of the switching power converter and a field effect transistor switch coupled to the primary winding of the transformer, current through the primary winding being generated while the field effect transistor switch is turned on and not being generated while the field effect transistor switch is turned off, the method comprising:
generating a control signal to turn on or turn off the field effect transistor switch during a plurality of switching cycles of the field effect transistor switch, each of the switching cycles including a first part during which the field effect transistor switch is turned on and a second part during which the field effect transistor switch is turned off; and
adjusting a magnitude of current of the control signal from a first level during a first duration of the first part of at least one of the switching cycles of the field effect transistor switch to a second level that is greater than the first level during a second duration of the first part of said one of the switching cycles, said second duration being later in time than said first duration.

10. The method of claim 9, wherein adjusting the magnitude of the control signal comprises:
adjusting the magnitude of current of the control signal from a first level during an earlier period of the second part of said one of the switching cycles to a second level during a later period of the second part of said one of the switching cycles.

11. The method of claim 9, wherein the driver control circuit comprises a first field effect transistor having variable on-resistance coupled in series to a second field effect transistor and a node between the first field effect transistor and the second field effect transistor are coupled to a gate of the field effect transistor switch and wherein adjusting the magnitude of current of the control signal comprises:
adjusting the on-resistance of the first field effect transistor to adjust the magnitude of current of the control signal during the first part of said at least one switching cycle; and
adjusting the on-resistance of the second field effect transistor to adjust the magnitude of current of the control signal during the second part of said at least one switching cycle.

12. The method of claim 11, wherein the on-resistance of the first field effect transistor is adjusted from a first resistance to a second resistance during the first part of said at least one switching cycle responsive to a timer reaching a predetermined time threshold from when the field effect transistor switch is turned on, and wherein the on-resistance of the second field effect transistor is adjusted from a third resistance to a fourth resistance during the second part of said at least one switching cycle responsive to the timer reaching a predetermined time threshold from when the field effect transistor switch is turned off.

13. The method of claim 12, wherein adjusting the magnitude of current of the control signal comprises: adjusting the on-resistance of the first field effect transistor from the first resistance to the second resistance during the first part of said at least one switching cycle responsive to a gate-to-source voltage of the field effect transistor switch passing a threshold value during the first part of said one of the switching cycles.

14. The method of claim 12, wherein adjusting the magnitude of current of the control signal comprises:
   adjusting the on-resistance of the first field effect transistor from the first resistance to the second resistance during the first part of said at least one switching cycle responsive to a drain-to-source voltage of the field effect transistor passing a threshold value during the first part of said one of the switching cycles.

* * * * *